(12) United States Patent
Shigeta et al.

(10) Patent No.: US 10,579,471 B2
(45) Date of Patent: Mar. 3, 2020

(54) STORAGE DEVICE AND ERROR CORRECTION METHOD FOR STORAGE DEVICE

(71) Applicant: TOSHIBA MEMORY CORPORATION, Tokyo (JP)

(72) Inventors: Chihoko Shigeta, Kunitachi Tokyo (JP); Yoshihisa Kojima, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 179 days.

(21) Appl. No.: 15/911,011

(22) Filed: Mar. 2, 2018

(65) Prior Publication Data

US 2018/0253347 A1 Sep. 6, 2018

Related U.S. Application Data

(60) Provisional application No. 62/465,915, filed on Mar. 2, 2017.

(51) Int. Cl.
*G06F 11/10* (2006.01)
*G06F 11/07* (2006.01)
(Continued)

(52) U.S. Cl.
CPC ........ *G06F 11/1048* (2013.01); *G06F 3/0614* (2013.01); *G06F 11/073* (2013.01); *G06F 11/0751* (2013.01); *G06F 11/08* (2013.01); *G06F 11/1004* (2013.01); *G06F 11/1068* (2013.01); *G06F 12/0246* (2013.01); *G06F 12/1027* (2013.01); *G06F 2212/1032* (2013.01); *G06F 2212/7201* (2013.01); (Continued)

(58) Field of Classification Search
CPC .. G06F 11/0751; G06F 11/073; G06F 3/0614; G06F 12/1027; G06F 11/08; G06F 11/1004; G06F 11/1048; G11C 29/04
See application file for complete search history.

(56) References Cited

U.S. PATENT DOCUMENTS 7,797,481 B2 * 9/2010 Lee ..................... G06F 12/0246
711/103
9,170,898 B2 10/2015 Porterfield
(Continued)

FOREIGN PATENT DOCUMENTS

JP 2014-32679 A 2/2014

*Primary Examiner* — Paul Contino
(74) *Attorney, Agent, or Firm* — Kim & Stewart LLP

(57) ABSTRACT

A storage device includes a non-volatile memory and a control circuit that reads data in units of cluster, and erase data in units of logical block which includes a plurality of clusters. Data in each cluster includes a first error correction code and each cluster is arranged in at least one error correction group, each including clusters and a second error correction code. The control circuit performs a refresh operation in units of cluster such that refresh target data in a cluster of a first logical block is moved to a cluster of a second logical block. A first error correction group related to the refresh target data includes the cluster of the first logical block before the moving, and the first error correction group related to the refresh target data includes a cluster of the first logical block and a cluster of the second logical block after the moving.

16 Claims, 31 Drawing Sheets

(51) Int. Cl.
*G06F 3/06* (2006.01)
*G06F 12/1027* (2016.01)
*G06F 12/02* (2006.01)
*G06F 11/08* (2006.01)
*G11C 29/04* (2006.01)
*G11C 29/52* (2006.01)

(52) U.S. Cl.
CPC ...... *G06F 2212/7205* (2013.01); *G11C 29/04* (2013.01); *G11C 29/52* (2013.01); *G11C 2029/0411* (2013.01)

(56) References Cited

U.S. PATENT DOCUMENTS

| | | | |
|---|---|---|---|
| 9,208,018 B1 * | 12/2015 | Northcott | G06F 11/1008 |
| 9,230,669 B2 | 1/2016 | Jung et al. | |
| 9,594,611 B2 | 3/2017 | Hashimoto | |
| 2003/0105921 A1 * | 6/2003 | Tomita | G06F 11/1088 |
| | | | 711/114 |
| 2007/0038802 A1 * | 2/2007 | Tsai | G06F 12/0246 |
| | | | 711/103 |
| 2007/0106925 A1 * | 5/2007 | Moore | G06F 11/1076 |
| | | | 714/770 |
| 2007/0198889 A1 * | 8/2007 | Moore | G06F 11/1076 |
| | | | 714/758 |
| 2009/0241010 A1 * | 9/2009 | Yano | G06F 11/1072 |
| | | | 714/764 |
| 2011/0066793 A1 * | 3/2011 | Burd | G06F 11/1028 |
| | | | 711/103 |
| 2012/0317340 A1 * | 12/2012 | So | G06F 11/1068 |
| | | | 711/103 |
| 2012/0317458 A1 * | 12/2012 | So | G06F 11/1044 |
| | | | 714/763 |
| 2014/0075099 A1 * | 3/2014 | Ooneda | G06F 11/1048 |
| | | | 711/103 |
| 2017/0300393 A1 * | 10/2017 | Sreedhar M | G06F 11/1658 |

* cited by examiner

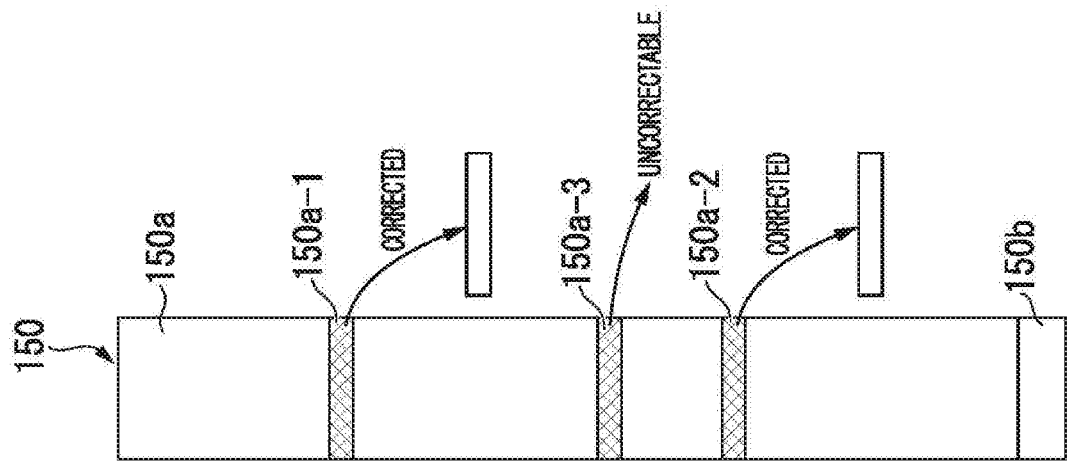
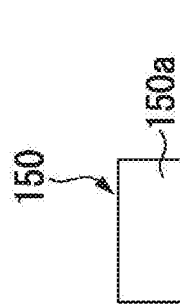
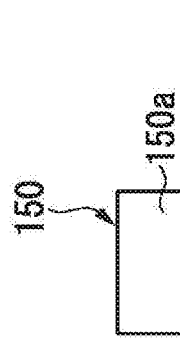
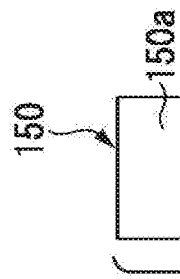

43

| LBA | PA | | |
|---|---|---|---|
| | LOGICAL BLOCK ID | LOGICAL PAGE ID | CLUSTER ID |
| | | | |
| | | | |
| | | | |
| ⋮ | ⋮ | | |

| CLUSTER ID | MOVING DESTINATION LOCATION |
|---|---|
| 0 | null |
| 1 | SECOND PA |
| ⋮ | ⋮ |
| 33 | null |

FIRST PA →

| CLUSTER ID | MOVING DESTINATION LOCATION |
|---|---|
| 0 | null |
| 1 | SECOND PA |
| ⋮ | ⋮ |
| 33 | null |

SECOND PA →

| CLUSTER ID | MOVING DESTINATION LOCATION |
|---|---|
| 0 | null |
| 1 | THIRD PA |
| ⋮ | ⋮ |
| 33 | null |

THIRD PA →

| CLUSTER ID | MOVING DESTINATION LOCATION |
|---|---|
| 0 | null |
| 1 | null |
| ⋮ | ⋮ |
| 33 | null |

| LOGICAL BLOCK ID | COUNT |
|---|---|
| 0 | 0 |
| 1 | 3 |
| ⋮ | ⋮ |

| | STATE | MOVING SOURCE LOCATION | REFERENCE FLAG |
|---|---|---|---|
| EACH BUFFER FOR ONE CLUSTER → | ... | ... | ... |
| | ... | ... | ... |

47

44

| CLUSTER ID | MOVING DESTINATION LOCATION |
|---|---|
| 0 | – |
| 1 | PA2 |
| ⋮ | ⋮ |

43

| LBA | PA |
|---|---|
| 0x21000 | PA1 |
| ⋮ | ⋮ |
| | |
| | |

ADDRESS TRANSLATION TABLE BEFORE CORRECTION MAP UPDATE

NO CHANGE

43

| LBA | PA |
|---|---|
| 0x21000 | PA1 |
| ⋮ | ⋮ |
| | |
| | |

ADDRESS TRANSLATION TABLE AFTER CORRECTION MAP UPDATE

| PHYSICAL BLOCK ID | COUNT |
|---|---|
| ○○○○ | 3 |
| ○○○○ | 0 |
| ⋮ | ⋮ |

STORAGE DEVICE AND ERROR CORRECTION METHOD FOR STORAGE DEVICE

CROSS-REFERENCE TO RELATED APPLICATIONS

This application is based upon and claims the benefit of priority from U.S. Provisional Patent Application No. 62/465,915, filed on Mar. 2, 2017; the entire contents of which are incorporated herein by reference.

FIELD

Embodiments described herein relate generally to a storage device and an error correction method for a storage device.

BACKGROUND

If an error of read data has been detected, a storage device may perform a refresh operation (hereinafter, simply referred to as "refresh") in units of logical block in which the read data having the error is written.

BRIEF DESCRIPTION OF THE DRAWINGS

FIGS. 1A-1D are each a diagram for explaining an example of a late escaping cluster issue.

FIG. 6 is a diagram showing an example of a correction map.

FIG. 7 is a diagram showing a flow in which a final moving destination location is found in the case where a correction map is used.

FIG. 8 is a diagram showing an example of a logical block-correction map reference counter.

FIG. 33 is a diagram showing a read disturb counter according to the fifth modification of the embodiment.

DETAILED DESCRIPTION

Figure 2:
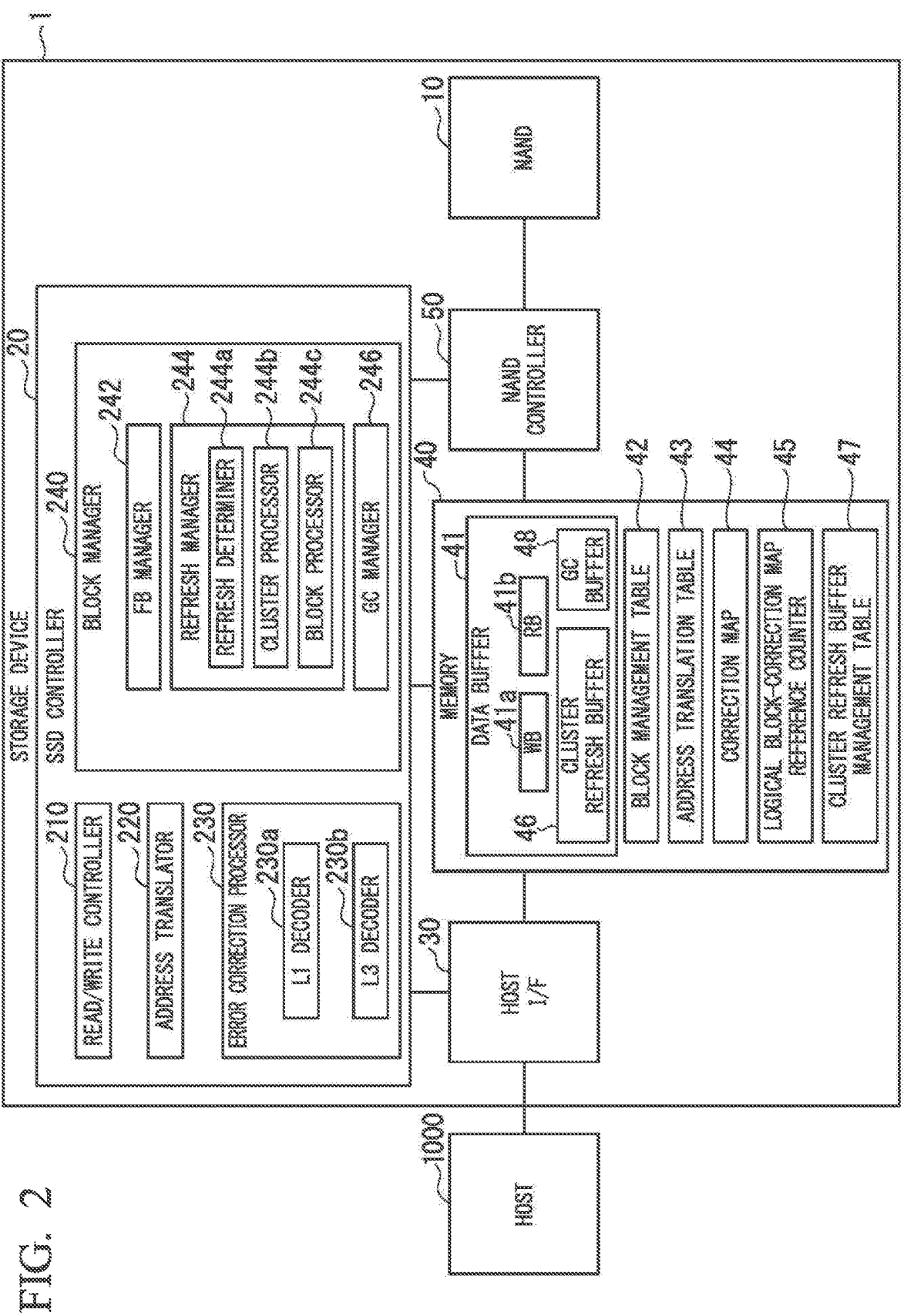
FIG. 2 is a diagram showing an example of a storage device according to an embodiment.

A storage device of an embodiment includes a non-volatile memory and a control circuit configured to store data in the non-volatile memory, read the data from the non-volatile memory in units of cluster, and erase data in units of logical block which includes a plurality of clusters. Data in each cluster includes a first error correction code and each cluster is arranged in at least one of a plurality of error correction groups, each of the error correction groups including a plurality of clusters and a second error correction code. The control circuit is further configured to perform a refresh operation in units of cluster such that refresh target data in a first cluster of a first logical block is moved to a second cluster of a second logical block, wherein a first error correction group related to the refresh target data includes the first cluster of the first logical block before the moving, and the first error correction group related to the refresh target data includes at least a cluster of the first logical block and a cluster of the second logical block after the moving.

First, a late escaping cluster issue which can be solved by a storage device of the embodiment will be described.

FIGS. 1A to 1D are diagrams for explaining an example of a late escaping cluster issue. As shown in FIG. 1A, an error correction group 150 includes 62 symbols of group data 150a (i.e., group data 150a composed of 62 cluster data) and 2 symbols of correction code 150b (i.e., second correction code 150b composed of two cluster data), as clusters. It is possible to correct up to 2-symbol group data 150a in the error correction group 150 by the correction code 150b. That is, as shown in FIG. 1B, when an error occurs in one cluster data 150a-1 among the group data 150a, the error in the cluster data 150a-1 can be corrected by the correction code 150b. And, the error-corrected cluster data 150a-1 is written in (relocated to) another logical block. Thereby, the cluster data 150a-1 in which the error occurred is recovered (i.e., has 'escaped' from the group successfully). The "error" indicates, for example, that an error correction using a correction code (e.g., first correction code described later) that is in the cluster has failed. Thereafter, as shown in FIG. 1C, even when an error occurs in a cluster data 150a-2 subsequent to the error of the cluster data 150a-1, still the error in the cluster data 150a-2 can be corrected by the correction code 150b. And, the error-corrected cluster data 150a-2 is written in (relocated to) another logical block. Thereby, the cluster data 150a-2 in which the error occurred is recovered (i.e., has 'escaped' from the group successfully). However, as shown in FIG. 1D, when an error occurs in a cluster data 150a-3 (that is a cluster trying to 'escape' late) subsequent to the errors of the cluster data 150a-1 and the cluster data 150a-2, the error in the cluster data 150a-3 (or an error in cluster data other than the cluster data 150a-3 in the error correction group 150) cannot be corrected by the correction code 150b anymore. That is, although the cluster data 150a-1 and the cluster data 150a-2 in which errors had occurred earlier can be corrected, the cluster data 150a-3 in the same error correction group 150, in which error occurred later, cannot be corrected. In this way, in the case where an error correction using the correction code 150b is performed, an event in which the error correction using the correction code 150b becomes impossible due to accumulation of errors or the like is referred to as the late escaping cluster issue in this specification.

Data whose error has been corrected by the correction code 150b and which has been written in another logical block is an example of "data on which a refresh in units of cluster (i.e., a cluster-unit refresh) has been performed" that is described later. The term "refresh" means rewriting (relocating) data stored in an area in a memory chip to another area or the same area in the memory chip, with an error corrected therein. Here, data subjected to the refresh in units of cluster is not limited to data whose error has been corrected by the (second) correction code 150b. For example, if an estimation value of a read disturb stress acting on a cluster is higher than a predetermined threshold value, the refresh in units of cluster may be performed on the data in the cluster without using an event, as a trigger, that an error correction using a correction code (e.g., first correction code described later) that is in the cluster has failed. In this case, the data subjected to the refresh in units of cluster is not the data whose error has been corrected using the correction code 150b but is data stored in a cluster in which an estimation value of a read disturb stress is higher than a predetermined threshold value.

Although the occurrence of the late escaping cluster issue has been conventionally avoided by performing refresh in a unit which is equal to or larger than the error correction group 150 such as a logical block. However, refreshing in units of large size causes an increase in a rewrite processing load and results in a decrease in performance of the storage device. On the other hand, the storage device 1 of the embodiment suppresses the occurrence of the late escaping cluster issue by managing a destination of refreshed data (e.g., data on which a refresh in units of cluster is performed, or data on which a refresh in another unit described later is performed), and makes correspondence between the clusters and the correction code 150b which are included in the error correction group 150 dynamically changeable.

Hereinafter, a storage device and an error correction method for the storage device according to an embodiment will be described with reference to the drawings.

[Storage Device]

FIG. 2 is a diagram showing an example of a storage device 1 of the embodiment. The storage device 1 may be a solid state drive (SSD), but is not limited thereto. The storage device 1 is to be connected to a host 1000 via a host interface (host I/F in the drawings) 30. One host 1000 may be connected to the storage device 1, but the embodiment is not limited thereto. A plurality of hosts 1000 may be connected to the storage device 1.

The host 1000 is, for example, a processor, an I/F controller, or the like provided in an information processing device such as a personal computer or a server device.

When the host 1000 attempts to write data to the storage device 1, the host 1000 outputs a write command to the storage device 1. When the host 1000 attempts to read data stored in the storage device, the host 1000 outputs a read command to the storage device 1. The write command and the read command each include a logical block address (LBA) as a logical address of access destination. The LBA is information for specifying a logical address of data in the storage device 1.

The host 1000 may use any key information in place of the LBA as the logical address. In this case, the storage device 1 performs a process using an address translation table for translating key information into a physical address, instead of the address translation table for translating the LBA into the physical address.

The storage device 1 may include a NAND flash memory 10 (hereinafter, simply denoted by "NAND"), an SSD controller 20, the host interface 30, a memory 40, and a NAND controller 50, but the embodiment is not limited thereto. Although the host interface 30 and the NAND controller 50 are not included within the SSD controller 20 in FIG. 2, the embodiment is not limited thereto, and the functions of the host interface 30 and the NAND controller 50 may be included in the SSD controller 20. The SSD controller 20 is implemented as, for example, an IC (integrated circuit). The SSD controller 20, the host interface 30, and the NAND controller 50 are implemented, for example, as a System on a Chip (SoC).

The NAND 10 includes a non-volatile semiconductor memory. The NAND 10 stores user data requested to be written in the write command. The user data is, for example, data generated by a process of the host 1000. The user data includes write data requested to be written by the write command and data that has already been written in the NAND 10 on the basis of the write command.

[Outline of NAND]

The NAND 10 may store system data of the storage device 1. The system data is data generated in the storage device 1 or data written in a manufacturing process of the storage device 1. The system data is data used for executing various processes in the storage device 1. The system data includes a block management table 42, an address translation table 43, a correction map 44, a logical block-correction map reference counter 45, and a buffer management table 47 for the refresh in units of cluster (hereinafter, referred to as "a cluster refresh buffer management table 47"), all of which are stored in the memory 40.

The NAND 10 may include a plurality of memory chips. Each of the plurality of memory chips includes a memory cell array. But, the embodiment is not limited thereto. Each memory cell array includes a plurality of physical blocks. The physical block includes a plurality of physical pages. Each physical block includes, for example, 256 physical pages. Each physical page includes, for example, four clusters. Writing by the NAND controller 50 to the NAND 10 is performed in units of physical page or in units of two or more physical pages. Reading by the NAND controller 50 from the NAND 10 is performed in units of cluster. Erasing of data in the NAND 10 is performed in units of physical block or in units of two or more physical blocks according to an instruction from the NAND controller 50. The SSD controller 50 makes an instruction for writing and reading to and from the NAND 10 in units of physical page, but the embodiment is not limited thereto.

The NAND 10 includes a plurality of error correction groups. Each of the plurality of error correction groups includes a plurality of clusters. A first correction code used for correcting data stored in a cluster is written in the cluster. A second correction code 150b is written in a part of clusters of the error correction group. The second correction code 150b is used for correcting an error of data if the error of the data read from the cluster of the error correction group cannot be corrected by the first correction code.

[SSD Controller]

The SSD controller 20 is realized by hardware such as a large scale integration (LSI) circuit, an application specific integrated circuit (ASIC), a field-programmable gate array (FPGA), a programmable logic device (PLD) or the like, but the embodiment is not limited thereto. The SSD controller 20 may be realized by a processor such as a central processing unit (CPU) executing a program stored in a program memory.

The SSD controller 20 includes a read/write controller 210, an address translator 220, an error correction processor 230, and a block manager 240, but the embodiment is not limited thereto.

The read/write controller 210 receives the write command transmitted from the host interface 30. If the write command and write data requested by the write command are received, the read/write controller 210 stores the write data in a data buffer 41 in the memory 40. The read/write controller 210 causes the NAND controller 50 to execute a write process of the write data requested by the write command.

[Log-Structured Writing Algorithm]

The log-structured writing (i.e., the incremental writing or the writing in an appending manner) algorithm will be described using a case of host writing as an example. The read/write controller 210 writes data in units of logical page into a write destination block, which is selected from free blocks and from which invalid data is erased. A free block is a logical block in which valid data is not stored and to which any correction maps 44 of other logical blocks do not refer. Valid data is data stored in a physical address associated with a logical address in the address translation table 43. If invalid data is erased from a free block, the free block may be handled as a write destination block. Invalid data is data stored in a physical address that is not associated with a logical address in the address translation table 43.

If a write command is received from the host 1000, the read/write controller 210 allocates a write buffer 41a in the memory 40, and then stores the logical address included in the write command and the write data in the write buffer 41a. According to writing of the write data in the write buffer 41a, the read/write controller 210 updates the address translation table 43 so that the logical address related to the write data corresponds to a physical address of the write buffer 41a. Subsequently, the read/write controller 210 writes the write data stored in the write buffer 41a to a write destination block in the NAND 10, for example, before an amount of write data stored in the write buffer 41a exceeds a predetermined value. According to writing of the write data to the NAND 10, the read/write controller 210 updates the address translation table 43 so that the logical address related to the write data corresponds to a physical address of the write destination block, and releases the write buffer 41a. Here, the read/write controller 210 updates a valid cluster counter according to updating the address translation table 43. Details of this process will be described later.

Further, when the write data is to be written in the NAND 10, the read/write controller 210 calculates a first correction code for every cluster based on the write data and writes, as a part of cluster data, the calculated first correction code in a write destination physical page.

Further, when the write data is written in the NAND 10, the read/write controller 210 defines one or more error correction group for a logical page. Each time writing is to be performed in units of logical page, the read/write controller 210 calculates a second correction code 150b for each error correction group based on the write data of the error correction group, and writes the calculated second correction code 150b in one or more clusters allocated in the error correction group.

Further, the read/write controller 210 writes, in the logical page, write log data that indicates the logical address corresponding to each cluster included in the logical page. The write log functions as a reverse lookup table with respect to the address translation table 43.

The read/write controller 210 changes the state of the write destination block into an active block after it is determined that no further writing is to be performed on the write destination block. The active block is a logical block for which writing has been completed.

The read/write controller 210 receives a read command transmitted by the host interface 30. The read/write controller 210 causes the NAND controller 50 to execute a data read process requested by the read command. Read data read from the NAND 10 by the NAND controller 50 is stored in a read buffer 41b in the memory 40. The read/write controller 210 transmits the read data stored in the read buffer 41b to the host 1000 through the host interface 30.

Although the description will be described below in detail, in the case of the refresh or garbage collection, the flow of data is different from that of the above-described case of host writing. That is, in the case of the refresh or the garbage collection, data is read from an area in the NAND 10 serving as a refresh source or a garbage collection source, and the read data is stored in the data buffer 41 in the memory 40 (e.g., a buffer 48 for the refresh and the garbage collection (GC) in the data buffer 41 (hereinafter, simply referred to as a "garbage collection buffer 48" for convenience of description)). Data subjected to the refresh or the garbage collection is written from the data buffer 41 to a write destination block of the NAND 10.

During refresh or garbage collection, when data subjected to the refresh or the garbage collection is written in the NAND 10, a refresh manager 244 or a garbage collection manager 246, which are described later, calculates a first correction code for every cluster based on the data subjected to the refresh or the garbage collection, and writes, as a part of cluster data, the calculated first correction code in a write destination physical page.

Further, when the data subjected to the refresh or the garbage collection is written in the NAND 10, the refresh manager 244 or the garbage collection manager 246 defines an error correction group for the logical page. The refresh manager 244 or the garbage collection manager 246 calculates a second correction code 150b for every error correction group based on the data subjected to the refresh or the garbage collection, and writes the calculated second correction code 150b in one or more clusters allocated in the error correction group.

According to writing of the data subjected to the refresh or the garbage collection to the NAND 10, the refresh manager 244 or the garbage collection manager 246 updates the address translation table 43 so that the logical address related to the data corresponds to an physical address in a write destination block.

Further, state transition of a block or generation of a free block during the refresh will be described in the explanation of refresh in units of logical block. State transition of a block or generation of a free block during the garbage collection is substantially the same as the state transition of a block or the generation of a free block during the refresh.

The address translator 220 translates a logical address specified in the read command into a physical address in the NAND 10. The address translator 220 performs address translation by referring to the address translation table 43.

[Error Correction]

The error correction processor 230 attempts to perform an error correction using the first correction code on read data read from the cluster of the NAND 10. Such error correction using the first correction code is performed by an L1 decoder 230a of the error correction processor 230. The read data is not limited to the data (host read data) read from the NAND 10 on the basis of a read command from a host 1000 but also includes data read from the NAND 10 through the refresh or the garbage collection.

The error correction processor 230 determines whether the error correction using the first correction code has succeeded or failed. Error correction using the first correction code fails if the number of error bits included in the data read from the clusters of NAND 10 exceeds a correction capability of the first correction code. In the following description, the cluster storing data on which the error correction using the first correction code has failed is described as a defective cluster. When the error correction using the first correction code on the read data from the cluster of NAND 10 has failed, the error correction processor 230 increments (i.e., updates) the number of defective clusters in the logical block including the defective cluster. The error correction processor 230 increments the counter of defective clusters for the logical block every time error correction using the first correction code has found to be failing on a 'new' cluster in which error correction failure has not been observed before.

If the error correction using the first correction code on the read data from the cluster of NAND 10 has failed, the error correction processor 230 attempts to correct the read data using the second correction code 150b. Such error correction using the second correction code is performed by an L3 decoder 230b of the error correction processor 230. The error correction using the second correction code 150b may be an erasure correction and/or an iterative correction. In the erasure correction, error correction is performed without using the read data on which the error correction using the first correction code has failed. In the iterative correction, error correction is performed using the read data on which the error correction using the first correction code has failed.

In the case of the read process based on the read command from the host 1000, the host read data corrected using the second correction code 150b is temporarily stored in the data buffer 41 of the memory 40 (e.g., the read buffer 41b in the data buffer 41) by the read/write controller 210 and then is sent to the host 1000. On the other hand, in the case of the refresh or the garbage collection, the read data corrected using the second correction code 150b is temporarily stored in the data buffer 41 of the memory 40 (e.g., the garbage collection buffer 48 in the data buffer 41) by the refresh manager 244 or the garbage collection manager 246 and then is written into a cluster of the NAND 10.

The first correction code is referred to as an intra-chip correction code, or an intra-page correction code. The second correction code 150b is referred to as an inter-chip correction code, or an inter-page correction code. The first correction code and the second correction code 150b may be a Hamming code, a horizontal/vertical parity code, a Reed-Solomon (RS) code, a low density parity-check (LDPC) code, or a Bose-Chaudhuri-Hocquenghem (BCH) code, but the embodiment is not limited thereto.

[Block Manager]

The block manager 240 includes a free block (FB) manager 242, the refresh manager 244, and the garbage collection (GC) manager 246, but the embodiment is not limited thereto.

The free block manager 242 updates the block management table 42 on the basis of a usage state of each logical block. Thereby, the free block manager 242 manages the usage state of each logical block. The usage state of each logical block is roughly divided into an active block, a free block, and a write destination block (i.e., an input block).

The free block manager 242 performs a process of generating a free block. The free block manager 242 reserves a predetermined number of logical blocks among the logical blocks included in the NAND 10 as free blocks. The free block manager 242 manages the free blocks as a list of logical blocks. The free block manager 242 may manage, for example, a list of active blocks and a list of free blocks. The free block manager 242 updates the number of active blocks or the number of free blocks when an active block or a free block is added or deleted.

The free block manager 242 changes one or more active blocks into free blocks if the current number of the free blocks has not reached a predetermined number. At this time, the free block manager 242 allocates a write destination block for garbage collection and instructs the garbage collection manager 246 to move all the valid data stored in the active block (the GC source block) to the write destination block (the GC destination block). Next, if the GC source block is not referred to by any correction maps 44 of other logical blocks in the storage device 1, the free block manager 242 changes the state of the GC source block that is an active block into a free block, thereby releasing the logical block. Thereby, the free block manager 242 generates a free block. The free block manager 242 moves all valid data in one or more active blocks to fewer free blocks than the one or more active blocks. As a result, the number of the active blocks is decreased and the number of the free blocks is increased. At this time, the free block manager 242 instructs the garbage collection manager 246 to transmit a read command, a write command, and an erase command to the NAND controller 50, and causes the NAND controller 50 to read, write, and erase the data. Erasing data of a free block may be performed any time before allocating the logical block as a write destination block (e.g., before writing of data).

In the above-described process, in the block management table 42, the free block manger 242 changes the state of the logical block corresponding to a logical block ID of the GC source block whose valid data has been moved to the write destination block into a "free" state. Thus, the free block manger 242 changes an active block into a free block. The free block manger 242 updates the list of free blocks when it has changed the active block to the free block.

[Refresh]

The refresh manager 244 includes a refresh determiner 244a, a cluster processor 244b, and a block processor 244c, but the embodiment is not limited thereto. The refresh manager 244 has a function of executing at least one of the following: refresh in units of cluster (cluster-unit refresh), a refresh in units of error correction group (error correction group-unit refresh), a refresh in units of physical block (physical block-unit refresh), a refresh in units of logical page (logical page-unit refresh), and a refresh in units of logical block (logical block-unit refresh). Some types of refresh which are performed not in units of error correction group, including the refresh in units of cluster and the refresh in units of physical block, generates/updates a correction map 44 to be described later. On the other hand, the refresh in units of error correction group, including the refresh in units of logical page and the refresh in units of logical block, does not use a correction map 44 to be described later.

(Refresh that Does Not Use Correction Map 44)

In the refresh in units of error correction group, the refresh is performed on all valid clusters included in an error correction group 150 that has satisfied a condition, without generating or updating the correction map 44. The "valid clusters" are clusters in which valid data is written. In the refresh in units of logical page, the refresh is performed on all valid clusters included a logical page that has satisfied a condition, without generating or updating the correction map 44. In the refresh in units of logical block, the refresh is performed on all valid clusters included in a logical block that has satisfied a condition, without generating or updating the correction map 44.

In such refresh that does not use the correction map 44, only valid clusters may be targets to be refreshed, but it is necessary to refresh all valid clusters included in a refresh target unit. The reason for this is as follows. That is, if only a part of the valid clusters included in the error correction group 150 is refreshed, when the error correction using the first correction code becomes failing in the remaining valid clusters, as described above with reference to FIGS. 1A to 1D, there is a problem that the error correction using the second correction code also fails. For this reason, in a case where the correction map 44 is not used, all the valid clusters existing in the error correction group are selected as refresh targets and refresh target data is written as a new error correction group 150 generated in another logical page, thereby avoiding, after the refresh is performed, occurrence of a read access to the error correction group 150 that was formed before the refresh is performed.

(Refreshing Using Correction Map 44)

In the refresh in units of cluster, a refresh is performed involving update of the correction map 44, for data in units of cluster (regardless of whether or not the data is valid or invalid) read from a target cluster that satisfied a condition (e.g., a cluster for which the error correction using the first correction code has failed, a cluster for which an estimation value of a read disturb stress is higher than a predetermined threshold value, or the like). In the refresh in units of cluster, data read in units of cluster from a target cluster that satisfied the condition is rewritten (relocated) as refresh target data into another cluster (a cluster included in a logical page different from the logical page including the target cluster that satisfied the condition). In the refresh in units of cluster, only a part of all valid data or only a part of invalid data stored in one error correction group 150 is refreshed. In addition, in this embodiment, the correction map 44 is used so that data moved to another cluster by the refresh in units of cluster is managed in association with the error correction group including the cluster serving as the moving source of such data. This content will be described in detail below.

In the refresh in units of physical block, for example, a refresh in units of cluster involving update of the correction map 44 is performed using, as a target, all clusters (regardless of whether or not the clusters are valid or invalid) included in the physical block that satisfied a condition (e.g., a physical block having a cluster for which the error correction using the first correction code has failed, a physical block in which a value of a read disturb counter exceeds a threshold value, or the like). In the refresh in units of physical block, the above-described refresh in units of cluster is performed on every cluster included in the physical block that satisfied the condition. The "read disturb counter" is a counter provided for each physical block, which is reset when data in the physical block is erased, and is incremented every time a sensing (read) operation is performed on any physical page in the physical block. If the value of the read disturb counter exceeds the threshold value, it is determined that reliability of data stored in the physical block corresponding to the read disturb counter is likely to be damaged due to a read disturb.

In the NAND 10, error correction is necessary because a threshold voltage distribution representing data written in memory cells gradually changes each time access to the NAND 10 is performed or as time elapses. The storage device 1 guarantees reliability of data by rewriting (relocating) data that is corrected in error correction using the second correction code 150b due to a failure of error correction using the first correction code, or data on which it is determined that refresh is necessary for another reason.

Here, the refresh includes a process of rewriting data corrected using the second correction code 150b into a write destination block if the error correction using the first correction code has failed and the error correction using the second correction code 150b succeeded. In a case where refresh is performed in units of cluster, the refresh manager 244 writes all data or at least all valid data among data stored in one or more defective clusters into the write destination block. Further, the refresh that does not use the correction map 44 described above relocates at least all valid data among data stored in each cluster included in the error correction group. On the other hand, in the refresh in units of cluster, only a part of the valid data or only a part of the invalid data included in the error correction group may be relocated as a refresh target.

As described with the late escaping cluster issue, for example, in an error correction group 150, the number of defective clusters in the error correction group 150 increases when another cluster included in the error correction group 150 has become a defective cluster. Here, in a comparative example, if a correspondence between a second correction code 150b included in an error correction group 150 and clusters included in the error correction group 150 is fixed, when the number of defective clusters included in the error correction group 150 increases and exceeds a correction capability of the second correction code 150b, error correction may fail on data read from the cluster included in the error correction group 150 based on the second correction code 150b. On the other hand, as will be described below, the storage device 1 according to the embodiment performs the refresh in units of cluster, a moving destination location of data subjected to the refresh in units of cluster is stored in the correction map 44, a definition of the error correction group 150 is dynamically changed (i.e., the correspondence between the second correction code 150b included in the error correction group 150 and clusters included in the error correction group 150 is dynamically changed by changing one or more clusters included in the error correction group 150) so that reliability of the data in the error correction group 150 can be guaranteed.

The refresh determiner 244a determines, for each logical block, whether to perform a refresh in units of logical block, in units of cluster, or other units.

The block processor 244c performs the refresh in units of logical block when the refresh determiner 244a determines to perform the refresh in units of logical block. The logical block subjected to the refresh in units of logical block is, for example, a logical block for which it is determined that the refresh is to be performed in units of logical block by the refresh determiner 244a based on the number of defective clusters exceeding an upper limit value. The refresh in units of logical block includes the following process. First, the block processor 244c reads, as refresh target data, data stored in the logical pages associated with the refresh target logical block. Next, the error correction processor 230 performs an error correction using the first correction code or the second correction code 150b on the refresh target data, if the refresh target data has one or more errors. Next, the block processor 244c writes the corrected refresh target data into the write destination block. After this process, the block processor 244c may release the refresh target logical block (logical block including the clusters that are moving source of data). Further, in response to the writing of data subjected to the refresh in units of logical block to the NAND 10, the block processor 244c updates the address translation table 43 so that the physical address corresponding to the logical address related to the data becomes a physical address in the write destination block. Further, in this case, in the write destination block, a new error correction group 150 including a cluster (a data moving destination cluster) in which the refresh target data is written is formed, as usual in the log-structured writing. In the following description, a logical block in which the refresh target data had been stored will be described as a "moving source cluster." A cluster into which the refresh target data is written (or is to be written) by performing a refresh is simply described as a "moving destination cluster."

The cluster processor 244b performs a refresh in units of cluster when the refresh determiner 244a determines to perform the refresh in units of cluster. A cluster subjected to the refresh in units of cluster is, for example, a defective cluster storing data on which an error correction using the first correction code has failed, but the embodiment is not limited thereto. The cluster subjected to the refresh in units of cluster is a cluster on which an estimation value of a read disturb stress acting is higher than a predetermined threshold value, or the like. The refresh in units of cluster includes the following process. First, the cluster processor 244b reads data stored in the refresh target cluster. For example, when an error correction using the first correction code for a cluster has failed, the error correction processor 230 performs an error correction on the data read from the refresh target cluster using the second correction code 150b in the error correction group that includes the cluster. Next, the cluster processor 244b stores data obtained by performing the error correction using the second correction code 150b on the read data in a buffer 46 for the refresh in units of cluster (hereinafter, referred to as "cluster refresh buffer 46"). Further, in a predetermined case (e.g., if an estimation value of a read disturb stress on a cluster is higher than a predetermined threshold value), the cluster processor 244b may store refresh target data read from a cluster subjected to the refresh in units of cluster in the cluster refresh buffer 46, without performing the correction using the second correction code 150b. Next, the cluster processor 244b writes the refresh target data subjected to the refresh in units of cluster from the cluster refresh buffer 46 to a write destination block in the NAND 10.

In the following description, the data written in the refresh target cluster (moving source cluster) is described as "data to be corrected", the data corrected by using the first correction code or the second correction code 150b is described as "corrected data."

[Garbage Collection]

The garbage collection manager 246 executes garbage collection. The garbage collection is a process of moving valid data from moving source logical blocks to moving destination logical blocks, and releasing the moving source logical blocks which do not contain any valid data and are not referred to by the correction maps 44 of other logical blocks so that these moving source logical blocks can be reused.

The garbage collection manager 246 refers to a valid data ratio registered in the block management table 42 and selects, as a garbage collection source block, a logical block having a lowest valid data ratio among the active blocks, but the embodiment is not limited thereto. The garbage collection manager 246 may select a logical block whose valid data ratio is lower than a predetermined value. Next, the garbage collection manager 246 reads valid data stored in the selected garbage collection source logical block, writes the read data to a write destination block, and updates the address translation table 43 to associate the logical address of the valid data to a physical address of the write destination block in which the valid data is written. Further, the garbage collection manager 246 refers to the logical block-correction map reference counter 45 described below and refers to a reference count of the garbage collection source logical block. If the count value of the garbage collection source logical block is zero (i.e., the garbage collection source logical block is not referred to by the correction maps 44 of other logical blocks), the garbage collection manager 246 releases the garbage collection source logical block. As a result, the number of free blocks can be increased. Releasing a logical block means changing the state of a logical block into a free block. The garbage collection manager 246 executes the garbage collection through the plurality of processes described above.

[Host Interface]

The host interface 30 is, for example, a serial advanced technology attachment (SATA) interface, a serial attached small computer system interface (SAS) interface, PCI express (PCIe) interface, NVMe interface, or the like. The host interface 30 receives a write command and a read command transmitted from the host 1000, and transmits the received write and read commands to the SSD controller 20. The host interface 30 receives data associated with the write command transmitted from the host 1000 and stores the received write data to the write buffer 41a. The host interface 30 receives data transmitted from the memory 40 and transmits the received data to the host 1000 as a response to the read command.

[Memory]

The memory 40 is a semiconductor memory device capable of being accessed at a higher speed than a speed of access to the NAND 10 and capable of being randomly accessed. The memory 40 may be a synchronous dynamic random access memory (SDRAM) or a static random access memory (SRAM), but the embodiment is not limited thereto.

The memory 40 has the data buffer 41, and stores the block management table 42, the address translation table 43, the correction map 44, the logical block-correction map reference counter 45, and the cluster refresh buffer management table 47. The data buffer 41 includes the write buffer 41a, the read buffer 41b, the cluster refresh buffer 46, and the garbage collection buffer 48. Here, the memory 40 need not be implemented as a single memory device, and may be implemented as a plurality of memory devices.

Data (e.g., user data) received on the basis of a write command from the host 1000 is stored in the write buffer 41a at least until the data is written in the NAND 10. The read buffer 41b stores the read data read from the NAND 10 on the basis of a read command from the host 1000 at least until the data is transmitted to the host interface 30. Refresh target data subjected to the refresh in units of cluster is stored in the cluster refresh buffer 46 until the data is written back to the NAND 10. Data subjected to the garbage collection is stored in the garbage collection buffer 48 until the data is written back to the NAND 10.

Figures 3A, 3B:
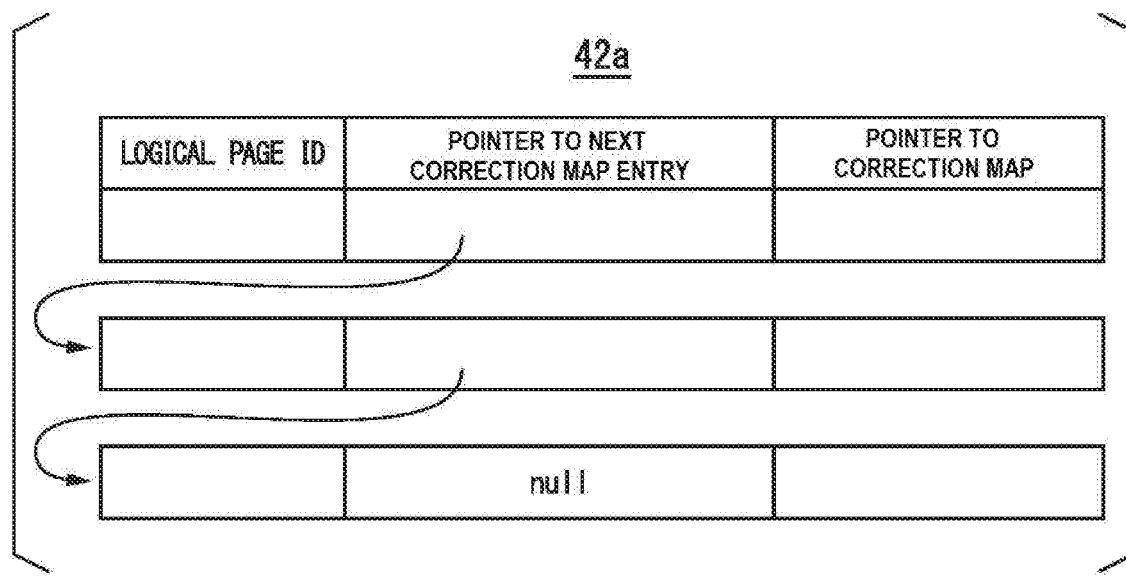
FIG. 3A is a diagram showing an example of a block management table.
FIG. 3B is a diagram showing an example of content of a correction map list.

FIG. 3A is a diagram showing an example of the block management table 42.

The block management table 42 associates each logical block ID with, for example: state information indicating one of free state, write destination state, and active state; a valid data ratio; correction map information; and the number of defective clusters. The logical block ID is identification information of the logical block.

The state information is information indicating whether each logical block is the free block, the write destination block (the input block), or the active block. The state information is updated by the SSD controller 20 in accordance with execution of a write process or an erasing process with respect to the NAND 10, refresh, garbage collection, or the like.

The valid data ratio is a value obtained by dividing a value of the valid cluster counter that counts the number of valid clusters included in the logical block by the number of clusters capable of being included in the logical block. A valid cluster is a cluster in which valid data is stored. When the address translation table 43 is updated in accordance with writing to the cluster in the logical block, the value of the valid cluster counter of the logical block indicated by the physical address before updating is decremented, and the value of the valid cluster counter of the logical block indicated by the physical address after updating is incremented. Because the value of the valid cluster counter of a free block is 0, the value of the valid data ratio of a free block is 0.

The correction map information indicates whether there is a correction map 44 associated with any logical page in the logical block indicated by the logical block ID. The correction map information includes a pointer to the correction map list 42a if there is a correction map 44 corresponding to the logical block ID. Also, the correction map information is null if there is no correction map 44 corresponding to the logical block ID. The correction map information is updated by the SSD controller 20 if a new correction map 44 is generated and if the correction map 44 is deleted.

FIG. 3B is a diagram showing an example of content of the correction map list 42a. The correction map list 42a has a linked list data structure formed by connecting zero or more correction map entries (described later) by one or more pointers. Each correction map entry in the correction map list 42a is associated with a logical page ID. For example, each correction map entry in the correction map list 42a includes a pointer to the next correction map entry and a pointer to a storage location of the correction map 44 related to the logical page indicated by the logical page ID. The "pointer to the next correction map entry" of the correction map entry at the end in the correction map list 42a is null, so that it is recognized that the next correction map entry does not exist.

The number of defective clusters of a logical block represents the number of clusters for which the error correction using the first correction code failed among the clusters in the logical block. The number of defective clusters is updated by the error correction processor 230 of the SSD controller 20 when the error correction using the first correction code newly fails. The fact that "the error correction using the first correction code newly fails" means that the error correction using the first correction code has failed with the data read from a cluster for which the error correction using the first correction code had not failed before. The error correction processor 230 performs the following process if the error correction using the first correction code fails.

Figures 4, 5:
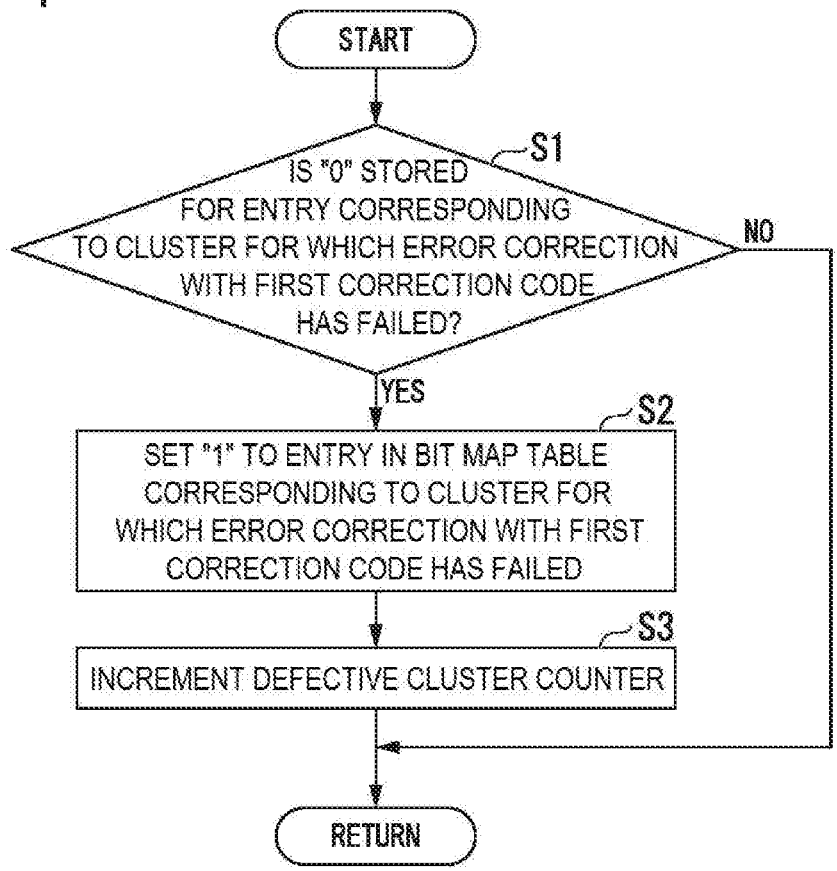
FIG. 4 is a flowchart showing a flow of a process for counting defective clusters.
FIG. 5 is a diagram showing an example of an address translation table.

FIG. 4 is a flowchart showing a flow of the process for counting defective clusters. The process of this flowchart is started when a failure of error correction using the first correction code has occurred. First, an example of a bitmap used to track whether or not a failure of error correction using the first correction code has occurred in a cluster will be described. Each entry of the bitmap corresponds to each cluster included in the logical block. In this bitmap, for example, "1" is set in an entry (a bit) corresponding to the cluster for which a failure of error correction has occurred already, and "0" is set in an entry corresponding to the cluster for which a failure of error correction has not occurred yet. Accordingly, if the entry corresponding to the cluster in the bitmap is set as 0, the error correction processor 230 determines that the failure of error correction using the first correction code has occurred for the first time in the corresponding cluster. On the other hand, if the entry corresponding to the cluster in the bitmap is set as 1, the error correction processor 230 determines that the failure of error correction using the first correction code has occurred not for the first time in the corresponding cluster. The bitmap is stored in the memory 41, and is written in the NAND 10 when the power is turned off. The bitmap of the entire logical block are initialized to 0 when the logical block is erased.

In this embodiment, when a failure of error correction using the first correction code occurs, the error correction processor 230 refers to the bitmap corresponding to the cluster for which the failure of error correction using the first correction code has occurred, and determines whether or not the entry corresponding to the cluster is set as "0" in the bitmap (S1). If the entry is set as "0", the error correction processor 230 determines that the failure of error correction using the first correction code has occurred for the first time with the cluster. On the other hand, if the entry is not set as "0", the error correction processor 230 determines that the failure of error correction using the first correction code has occurred not for the first time with the cluster.

If the entry corresponding to the cluster for which the failure of error correction using the first correction code has occurred is set as "0" (YES in S1), the error correction processor 230 sets the entry corresponding to the cluster in the bitmap to "1" (S2), and increments the number of defective clusters with the logical block including the cluster (S3). On the other hand, if the entry corresponding the cluster for which the failure of error correction using the first correction code has occurred is not set as "0" (NO in S1), the processes of S2 and S3 are skipped.

FIG. 5 is a diagram showing an example of the address translation table 43. The address translation table 43 is a table in which a physical address (PA) is associated with a logical address such as an LBA. The logical address is information for specifying a location of data in the storage device 1 viewed from the host 1000. The physical address represents a storage location of data in the NAND 10 or a storage location in the data buffer 41. The address translation table 43 is used, for example, to read the latest data in response to a read command specifying a logical address. The physical address is represented by a logical block ID, a logical page ID, a cluster ID, and the like. The cluster ID is information for specifying a cluster in a logical page. A method of representing a physical address is not limited to that illustrated in FIG. 5.

The address translation table 43 is referred to when reading of data is executed. The address translation table 43 is updated when writing of data is executed. The writing of data includes not only writing data based on a write command from the host 1000 but also writing data in the refresh process or the garbage collection. Here, in the refresh in units of cluster, the address translation table 43 may not be updated in some cases.

[Correction Map]

Hereinafter, the correction map 44 will be described. When refresh in units of cluster has been executed, the correction map 44 is generated and/or updated in units of logical page that includes a moving source cluster of moved data. The correction map 44 is, for example, fixed-length data. That is, in the correction map 44, an entry is allocated for each cluster regardless of whether data stored in the cluster has been moved or not. When the entry corresponding to the cluster stores, for example, a null value, it is recognized that data in the cluster is not moved.

FIG. 6 is a diagram showing an example of the correction map 44. The correction map 44 is a map in which a physical address of a next (one step ahead) destination is registered as a "moving destination location", as the entry corresponding to the cluster ID of the moving source cluster. If the value of the destination location is not null, the destination location indicates the physical address (second PA; that may be a location in the cluster refresh buffer) to which the data read from the moving source cluster corresponding to the cluster ID and moved by the refresh in units of cluster (e.g., the data which is read from the moving source cluster corresponding the cluster ID and on which the error correction is performed). If the destination location is null, it indicates that the data stored at the address (first PA) corresponding to the cluster ID of the moving source cluster has not been moved.

In order to search for the correction map 44 related to a certain cluster, the SSD controller 20 extracts a logical block ID, a logical page ID, and a cluster ID in a logical page based on the physical address of the cluster, acquires a pointer for the correction map list 42a corresponding to the logical block ID with reference to the block management table 42, follows the correction map list 42a in order until the correction map entry corresponding to the logical page ID is hit, and searches for the entry corresponding to the cluster ID in the correction map 44 if the correction map entry corresponding to the logical page ID is hit. If the target entry is not found anywhere in this process, the SSD controller 20 determines that there is no correction map 44 for the cluster.

In the correction map 44, the moving destination location is a moving destination location one step ahead that corresponds to one refresh (relocation). Accordingly, if data has been moved a plurality of times of the refresh in units of cluster, the address registered in the destination location in the correction map 44 is further referred to and an address registered as the moving destination location is repeatedly referred to until the moving destination location is null, so that it is possible to find the final moving destination location. FIG. 7 is a diagram showing a flow in which the final moving destination location is found. As in FIG. 6, the physical address corresponding to the moving source cluster is defined as a first PA. As shown, a second PA is registered as the moving destination location corresponding to the first PA in the correction map 44. Furthermore, a third PA is registered as the moving destination location of the cluster ID corresponding to the second PA in the correction map 44. Then, in the entry of the moving destination location of the cluster ID corresponding to the third PA in the correction map 44, the information indicating the moving destination location is not registered (null). In this case, it is found that the data had been stored in the first PA has been eventually stored in the third PA.

[Reference Counter]

Figure 8:
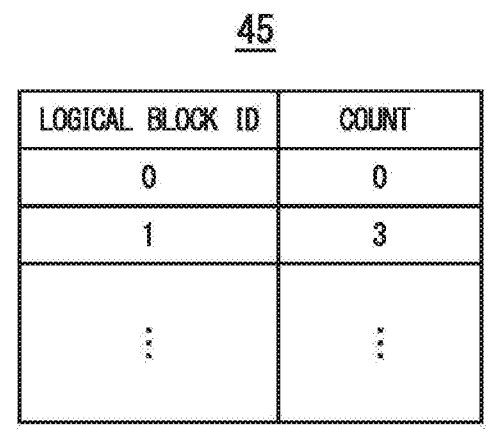

FIG. 8 is a diagram showing an example of the logical block-correction map reference counter 45. The logical block-correction map reference counter 45 is data in which a logical block ID is associated with a count value. The count value indicates the number of clusters moved from the outside of the logical block among clusters for which writing has been performed in the logical block according to the refresh in units of cluster.

Also, all information of the block management table 42, the address translation table 43, the correction map 44, and the logical block-correction map reference counter 45 do not have to be stored in the memory 40. Information of the block management table 42, the address translation table 43, the correction map 44, and the logical block-correction map reference counter 45 may be stored in the NAND 10. In this case, when the information of the block management table 42, the address translation table 43, the correction map 44, and the logical block-correction map reference counter 45 is referred to or updated, the SSD controller 20 may load the necessary information from the NAND 10 into the memory 40. The functions of the cluster refresh buffer 46 and the cluster refresh buffer management table 46 will be described later.

[Configuration of NAND]

The NAND controller 50 includes a NAND interface 52 (see FIG. 9), a DMA controller (not shown), and the like, but the embodiment is not limited thereto. The NAND interface 52 performs an interface process with the NAND 10. The NAND controller 50 writes data temporarily stored in the data buffer 41 to the NAND 10. The NAND controller 50 reads data stored in the NAND 10 and stores the read data in the data buffer 41.

Figure 9:
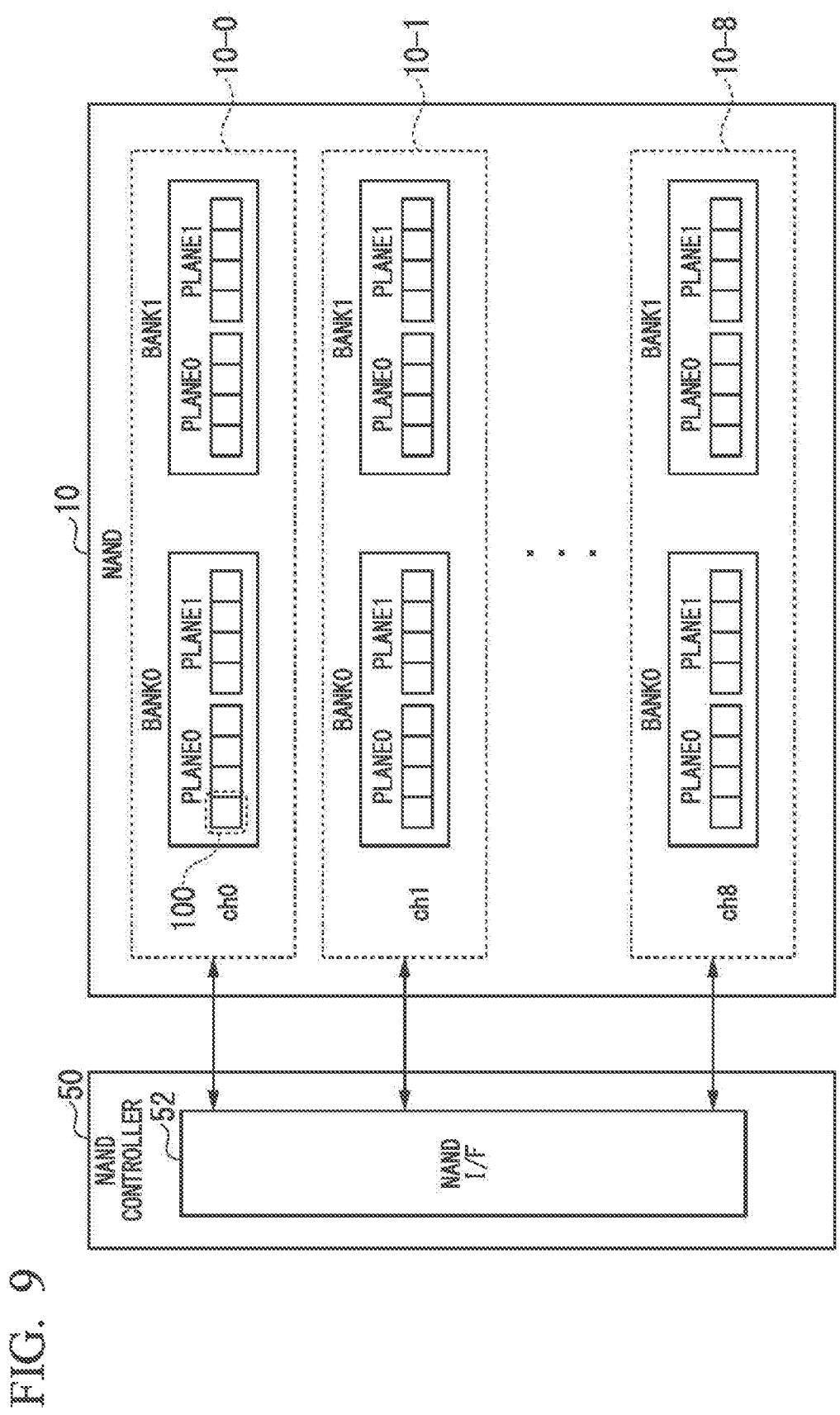
FIG. 9 is a diagram showing a relationship between a NAND interface and a NAND.

FIG. 9 is a diagram showing the relationship between the NAND interface 52 and the NAND 10 in the embodiment. The NAND 10 includes nine channels (ch0 to ch8). Each channel corresponds to a signal input/output circuit (I/O). The NAND 10 includes parallel operation elements 10-0 to 10-8 corresponding to the channels ch0 to ch8, respectively. Each of the parallel operation elements 10-0 to 10-8 operates independently of other parallel operation elements 10-0 to 10-8.

Each of the parallel operation elements 10-0 to 10-8 includes two BANKs (BANK0 and BANK1). The BANK0 and BANK1 may perform an interleave operation. That is, the NAND interface 52 may send an instruction for executing read, write, and erase operations on BANK0 and BANK1 to work in parallel. Each of BANK0 and BANK1 includes two PLANEs (PLANE0 and PLANE1). Each PLANE includes one physical page, which includes four clusters 100, on one logical page. The clusters in one BANK in one channel in one logical page are on the same chip.

The NAND interface 52 accesses the NAND 10 in parallel via nine channels. "Access" includes at least one of: transmission of a read request to the NAND 10; transmission of a write request to the NAND 10, transmission of an erase request to the NAND 10, transmission of write data corresponding to the write request, and reception of read data corresponding to the read request, but the term "access" is not limited thereto.

Figure 10:
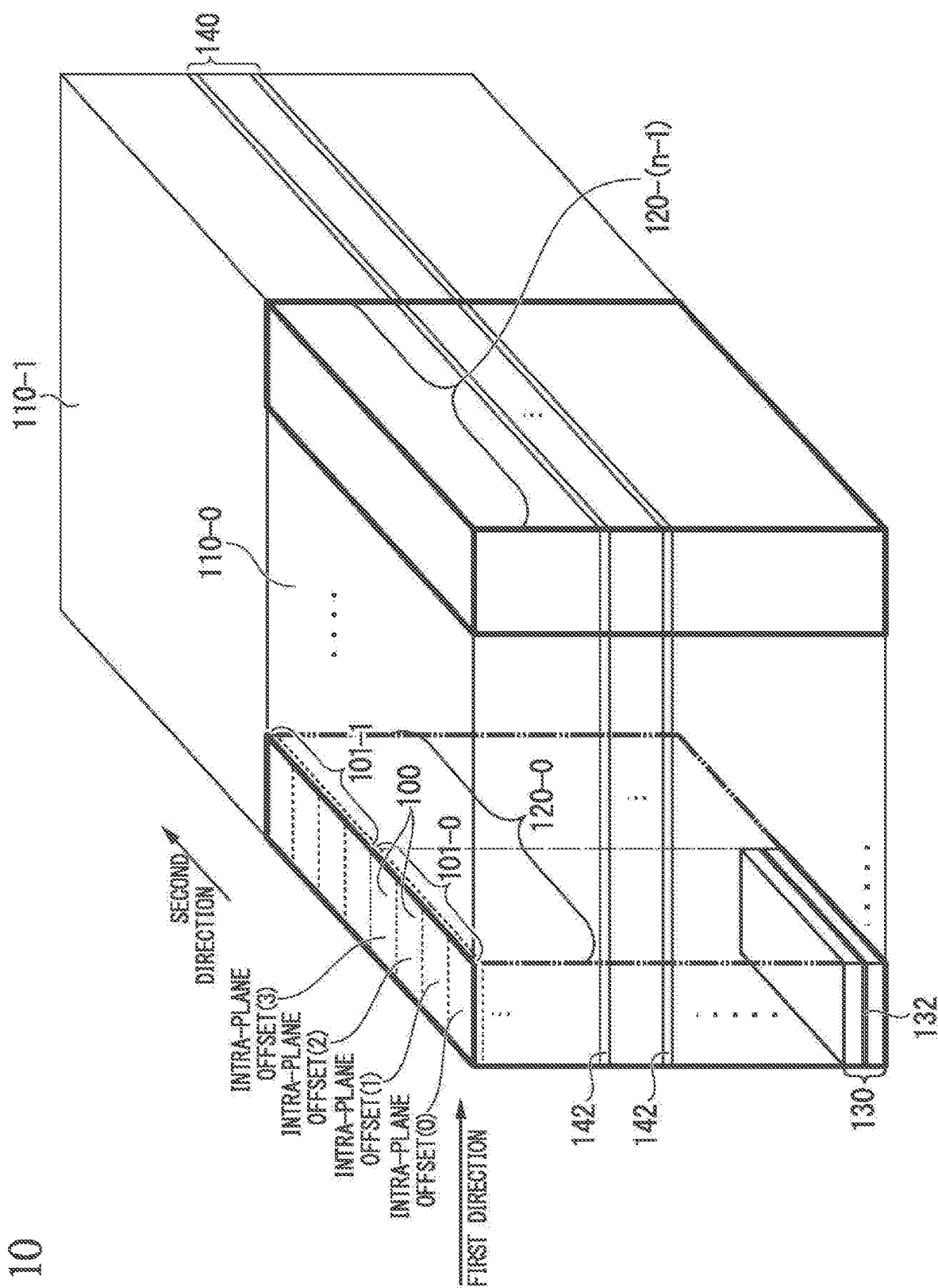
FIG. 10 is a schematic diagram showing a relationship between a logical block, logical pages, NAND chips, BANKs, PLANEs, and clusters.

FIG. 10 is a schematic diagram showing the relationship between logical blocks, logical pages, a NAND chip, BANKs, PLANEs, and clusters in the embodiment. FIG. 10 schematically shows error correction grouping of a data storage area in the storage device 1, and does not show a physical positional relationship. For convenience, although a BANK and a PLANE are shown in the relationship shown in FIG. 9, the BANK and the PLANE may be expressed in independent dimensions. Also, in FIG. 10, two BANKs 110-0 and 110-1 having the same configuration are illustrated side by side in a second direction. If distinguishing between the BANKs is absent, each of them is simply referred to as a BANK 110.

The BANK 110 includes n NAND chips 120-0 to 120-(n-1). n is a natural number greater than or equal to 1. The plurality of NAND chips 120-0 to 120-(n-1) are arranged in a direction in which the plurality of channels are arranged (hereinafter, referred to as a first direction). Each of the NAND chips 120-0 to 120-(n-1) is divided into a PLANE 101-0 and a PLANE 101-1.

The PLANE 101-0 and the PLANE 101-1 are arranged in a second direction. The PLANE 101-0 and the PLANE 101-1 include peripheral circuits which operate in parallel. The PLANE 101-0 and PLANE 101-1 may write, read, or erase data at the same time, but the embodiment is not limited thereto. The PLANE 101-0 and the PLANE 101-1 may operate with only one PLANE (single plane operation).

The PLANE 101-0 and the PLANE 101-1 each include four clusters 100 on one logical page.

Four clusters 100 are arranged in the second direction. The four clusters 100 correspond to one physical page 132. If the capacity of one cluster 100 is, for example, 4.5 kB, the capacity of one physical page 132 is 18 kB. The physical block 130 includes a plurality of physical pages 132. The physical block 130 includes 256 physical pages 132, for example. The capacity of the physical block 130 in the example is 4608 kB. The physical block 130 is a minimum erasing unit within a single chip. Here, since the four clusters 100 are arranged at different locations, the four clusters 100 have different intra-PLANE offsets (in-PLANE cluster locations). "Intra-PLANE offset" means the location of the cluster in each PLANE (PLANE 101-0 or PLANE 101-1) and means an ordering location in the second direction (an ordering location in the four clusters) in the four clusters included in each PLANE. The four clusters 100 in one physical page 132 are distinguished and identified from each other according to the intra-PLANE offsets.

Figure 11:
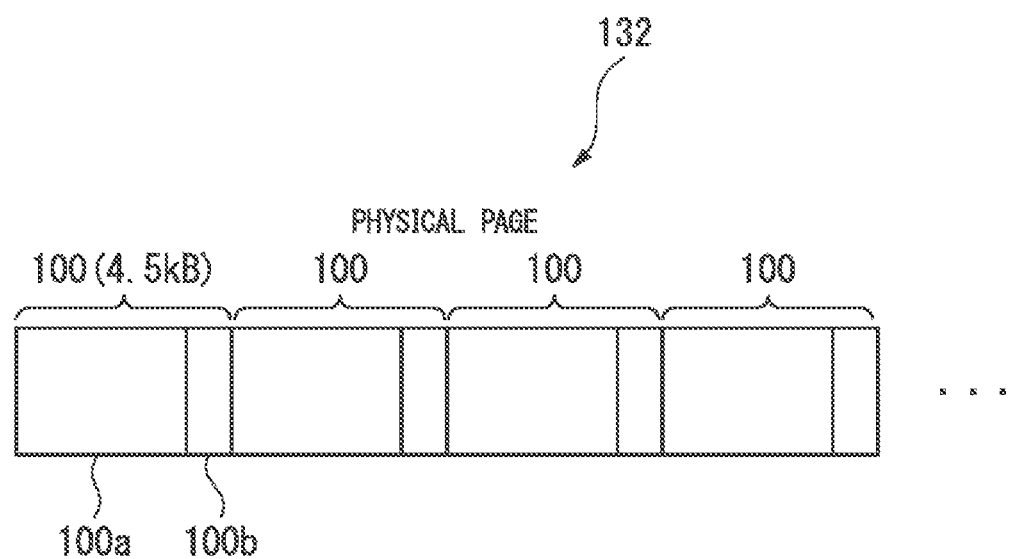
FIG. 11 is a diagram showing an example of a physical page.

FIG. 11 is a diagram showing an example of a physical page 132. The physical page 132 includes four clusters 100. Data stored in the cluster 100 includes cluster data 100$a$ (e.g., 4 kB) and the first correction code 100$b$ (e.g., 0.5 kB). The data 100$a$ is, for example, user data, system data, or data that is a part of the second correction code 150$b$. The correction code 100$b$ is a code string used for correcting the cluster data 100$a$. In the specification, the data 100$a$ and the correction code 100$b$ are collectively referred to as "cluster data." For example, the cluster data includes data (data constituting one symbol of the group data 150$a$ or data constituting one symbol of the correction code 150$b$) in each cluster included in the error correction group 150 described with reference to FIG. 1.

Returning to FIG. 10, the logical block 140 includes a plurality of logical pages 142. The logical page 142 includes one or more physical pages 132, each physical page belonging to different combination of a channel 10, a BANK 110, and a PLANE 101. The size of logical page 142 is greater than or equal to the size of the error correction group 150 (see FIG. 12) including the plurality of clusters 100 and smaller than the size of the logical block 140. The logical block 140 is a unit of data erasing operation in the storage device 1. The logical block 140 includes one or more physical blocks 130. Here, the physical address of the NAND 10 is information indicating a location unique to each of the clusters 100 included in the NAND 10 in the storage device 1.

Figure 12:
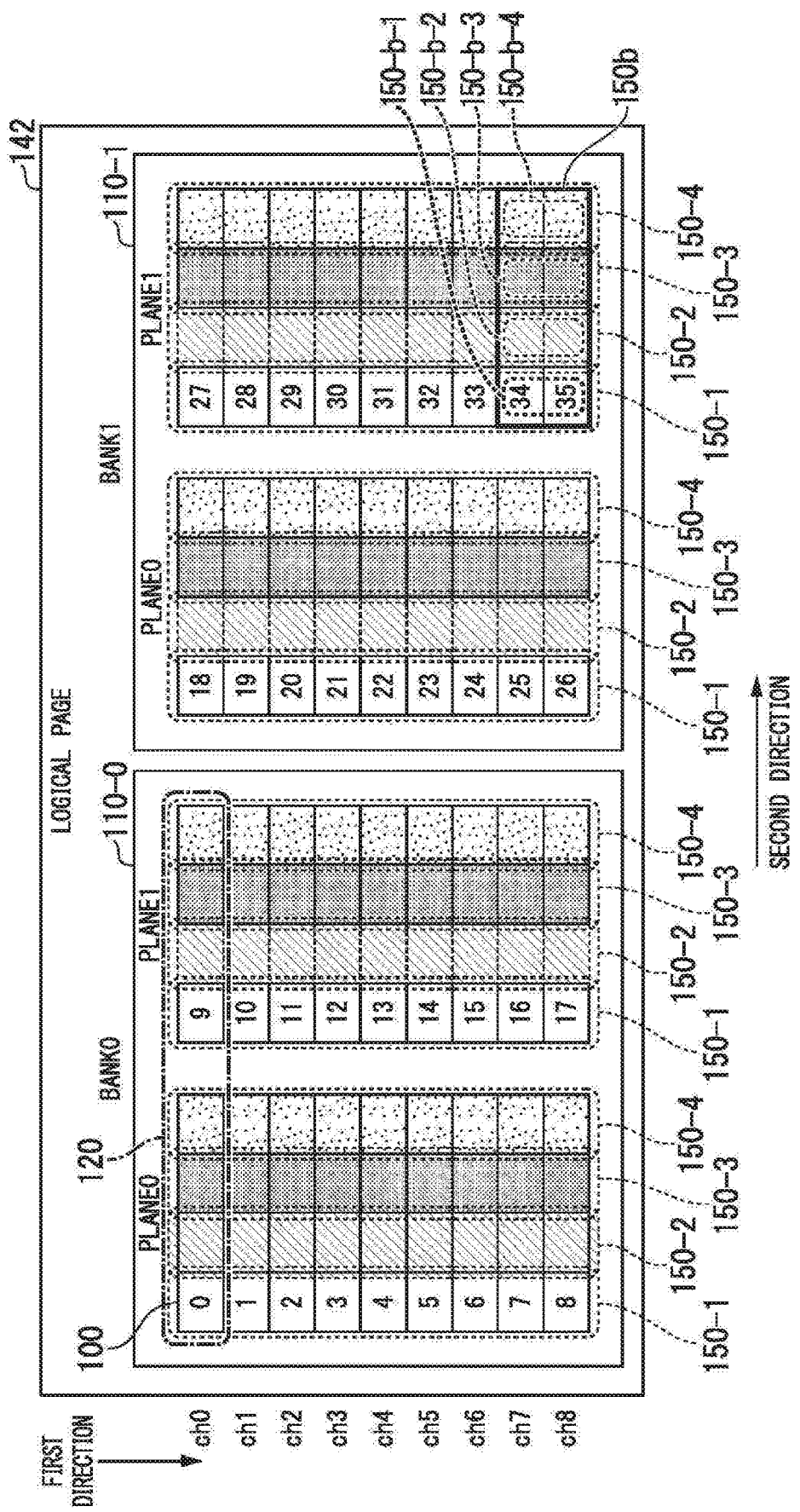
FIG. 12 is a diagram showing an example of the logical page.
Figure 13:
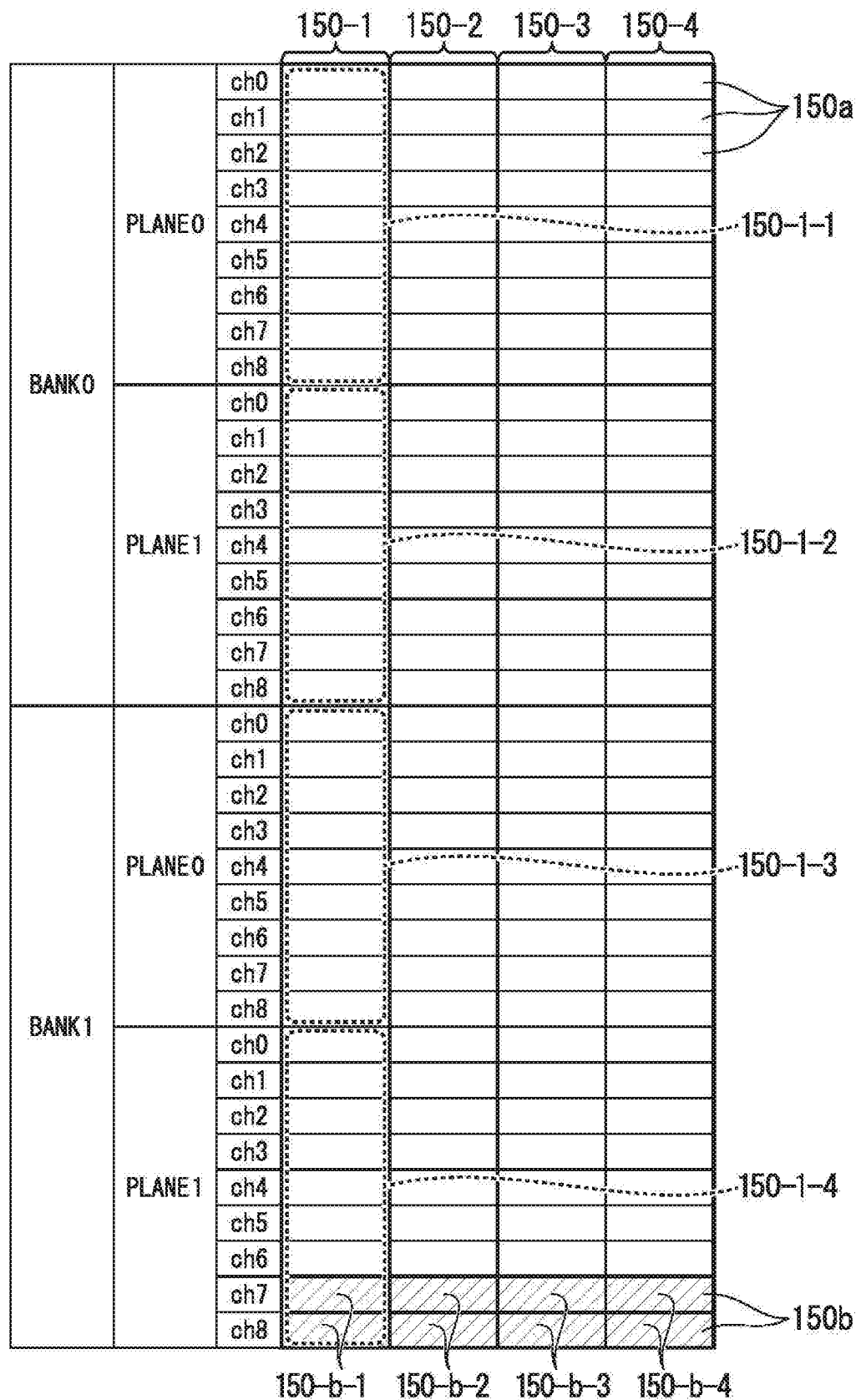
FIG. 13 is a diagram showing an example of an error correction group.

FIG. 12 is a diagram showing an example of the logical page 142 in the embodiment. FIG. 13 is a diagram showing an example of the error correction group. The error correction group is a group related to the second correction code.

In FIG. 12, a plurality of clusters 100 of the channels ch0 to ch8 are illustrated side by side in the second direction. That is, the plurality of clusters 100 arranged in a row in the second direction in FIG. 12 are accessed via the channels ch0 to ch8, respectively. A set of clusters 100 corresponding to numbers 0 to 35 among the clusters 100 included in the logical page 142 is the error correction group 150-1 shown in FIG. 13. The error correction group 150-1 includes a set 150-1-1 of clusters 100, a set 150-1-2 of clusters 100, a set 150-1-3 of clusters 100, and a set 150-1-4 of clusters 100 in FIG. 13. The set 150-1-1 of clusters 100 is nine clusters 100 corresponding to numbers 0 to 8. The set 150-1-2 of clusters 100 is nine clusters 100 corresponding to numbers 9 to 17. The set 150-1-3 of clusters 100 is nine clusters 100 corresponding to numbers 18 to 26. The set 150-1-4 of clusters 100 is nine clusters 100 corresponding to numbers 27 to 35.

A combination of the BANK 110, the PLANE 101, and the channel in each of the 36 clusters 100 included in the error correction group 150-1 is different from those in other clusters 100 included in the error correction group 150-1. That is, each of the 36 clusters 100 included in the error correction group 150-1 is included in a different physical block. In other words, each physical block of 36 physical blocks includes one cluster of the 36 clusters included in the error correction group 150-1. Therefore, even if a burst error occurs in one physical block among the 36 physical blocks, only an error of a single symbol occurs in the error correction group 150-1 to which the second correction code 150b-1 belongs. Further, in the configuration of the error correction group shown in FIG. 13, since data are stored only for two symbols per one NAND chip 120 for one error correction group, and the correction capability of the second correction code 150b is greater than or equal to that for two symbols, it is possible to correct data using the second correction code 150b even when one NAND chip 120 has failed.

Similar to the error correction group 150-1, each of error correction groups 150-2, 150-3, and 150-4 includes 36 clusters 100. The 36 clusters 100 are a set of clusters 100 corresponding to rows indicated by numbers 0 to 35 in FIG. 12. Each of the 36 clusters 100 included in each of the error correction groups 150-2, 150-3, and 150-4 has a different combination of the BANK 110, the PLANE 101, and the channel. In the following description, if error correction groups are not distinguished each other, a hyphen and a number are omitted and each error correction group is simply described as an error correction group 150. Also, the error correction group 150 may include 36 clusters 100, but the embodiment is not limited thereto. When a physical block 130 among a plurality of physical blocks 130 including clusters in the error correction group 150 fails, the failed physical block 130 may be treated as a defect and the error correction group 150 may be formed with less than 36 clusters from which the cluster of the failed physical block 130 is excluded.

The group data 150a is written in clusters 100 denoted by numbers 0 to 33 among the clusters 100 included in the error correction group 150. The group data 150a corresponds to the cluster data 100a and the first correction code 100b written in each cluster 100.

The second correction code 150b is written in the cluster 100 denoted by numbers 34 to 35 among the clusters 100 included in the error correction group 150. The second correction code 150b is calculated on the basis of the cluster data 100a stored in the clusters 100 denoted by numbers 0 to 33. The second correction code 150b is data used for error correcting for the group data 150a associated with the error correction group 150.

[Refresh in Units of Cluster]

Figure 14:
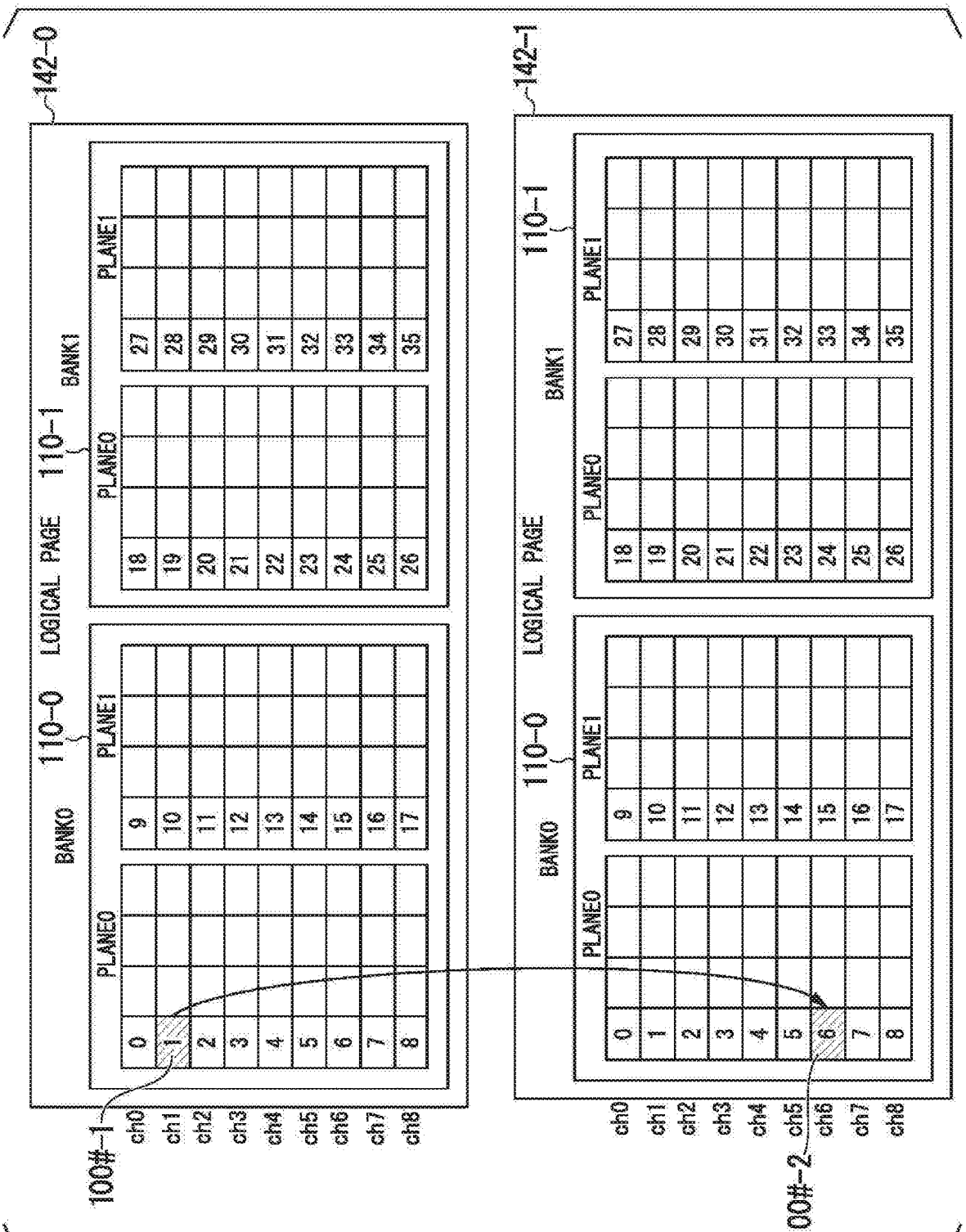
FIG. 14 is a diagram showing a refresh in units of cluster.

FIG. 14 is a diagram showing the refresh in units of cluster in the embodiment. In FIG. 14, numbers of "0" to "35" for clusters 100 included in each of the logical pages 142-0 and 142-1 are denoted only for convenience of description and do not indicate a relationship between the clusters. For example, the cluster 100(0) denoted by number "0" of the logical page 142-0 and the cluster 100(0) denoted by number "0" of the logical page 142-1 are not relating, although they have the same number.

If the cluster data (1) is read from the cluster 100(1) of ch1 of PLANE0 of BANK0 in the logical pages 142-0 included in the logical block 140-1 and the error correction using the first correction code 100b for the cluster data (1) has failed, the error correction processor 230 performs the error correction using the second correction code 150b for the cluster data (1). Then, the SSD controller 20 writes data that has been corrected using the second correction code 150b to a cluster 100(6) in ch6 of PLANE0 of BANK0 in the logical page 142-1 included in a refresh write destination block. Actually, data is temporarily stored in the cluster refresh buffer 46 and written to the cluster of the NAND 10 thereafter. In this description, a cluster 100(1) of the logical page 142-0 in which data subjected to the refresh in units of cluster (e.g., data with which the error correction using the first correction code has failed) is written, is described as a moving source cluster 100#-1, and a cluster 100(6) of the logical page 142-1 to which corrected data is written is described as a moving destination cluster 100#-2. The SSD controller 20 registers at least the physical address of the moving destination cluster 100#-2 in the correction map 44 corresponding to the logical page 142-0 that includes the moving source cluster. A series of these processes described above realizes refresh in units of cluster.

Figure 15:
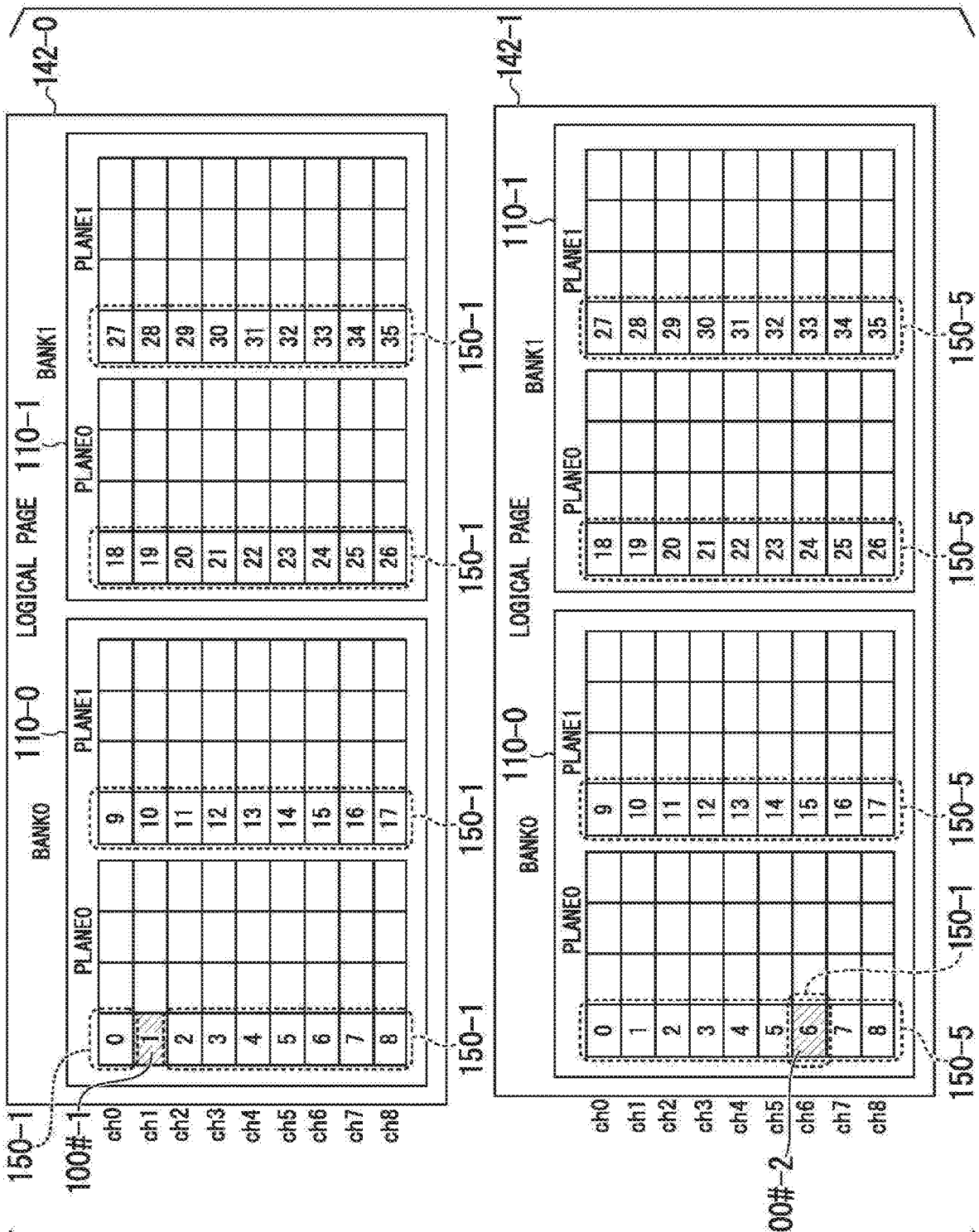
FIG. 15 is a diagram showing an aspect in which a cluster constituting a part of the error correction group is changed.

When the refresh in units of cluster is performed, clusters constituting the error correction group 150 are changed. FIG. 15 is a diagram showing an aspect in which a cluster constituting a part of the error correction group 150 is changed. Data of the moving source cluster 100#-1 is excluded from the error correction group 150-1 (see FIG. 12), and data of the moving destination cluster 100#-2 is added. The moving destination cluster 100#-2 is also included in an error correction group 150-5 in the logical page 142-1.

Here, the refresh in units of cluster related to data on which the error correction using the first correction code 100b has failed and on which the error correction using the second correction code 150b has succeeded, is described. However, the data subjected to the refresh in units of cluster is not limited to data that is attempted to be corrected using the first correction code 100b or the second correction code 150b, but may be data that does not involve such error correction.

Figures 16, 17, 18:
FIG. 16 is a diagram showing an example of content of a cluster refresh buffer management table.
FIG. 17 is a diagram showing an example of the correction map that has been updated.
FIG. 18 is a diagram showing examples of the address translation tables before and after the correction map is updated as shown in FIG. 17.

Details of an operation including the cluster refresh buffer 46 will be described below. The refresh in units of cluster is executed in the order of (1) storing refresh target data from the moving source cluster in the NAND 10 to the cluster refresh buffer 46, and (2) writing the refresh target data from the cluster refresh buffer 46 to the moving destination cluster in the NAND 10. Information of the refresh target data stored in the cluster refresh buffer 46 is managed by the cluster refresh buffer management table 47. FIG. 16 is a diagram showing an example of content of the cluster refresh buffer management table 47. For example, for each buffer corresponding to one cluster, the cluster refresh buffer management table 47 stores a state indicating whether the buffer is in use or unused, a moving source location, and a reference flag. In the refresh in units of cluster, the SSD controller 20 changes the state of the buffer of one cluster related to the refresh target data to "use" and sets the reference flag corresponding to the buffer to "1" when the refresh target data is stored in the cluster refresh buffer 46. When the refresh target data is stored in the cluster refresh buffer 46, the SSD controller 20 updates the correction map 44 of the logical page including moving source cluster. For example, the SSD controller 20 registers the physical address of cluster refresh buffer 46 in which the refresh target data is stored as the moving destination location corresponding to the cluster ID of the moving source cluster in the correction map 44 of the logical page including the moving source cluster.

Next, when the SSD controller 20 attempts to write the refresh target data stored in the cluster refresh buffer 46 to the NAND 10, the SSD controller 20 confirms that the corresponding reference flag is 1 by referring to the cluster refresh buffer management table 47, and then writes the refresh target data stored in the buffer whose reference flag is 1 to the moving destination cluster in the NAND 10. The SSD controller 20 updates the moving destination location corresponding to the cluster ID of the moving source cluster to the moving destination location (the physical address of the moving destination cluster) in the NAND 10 of the refresh target data, in the correction map 44 related to the logical page including the moving source cluster of the refresh target data. The SSD controller 20 releases the buffer by changing the state of the buffer for the cluster having stored the refresh target data to be "unused".

On the other hand, when the logical block for the moving source of the refresh target data stored in the cluster refresh buffer 46 is released, the SSD controller 20 sets the reference flag corresponding to the buffer for the cluster in which the refresh target data is stored to "0". At this time, the SSD controller 20 releases the buffer, but the data stored in the buffer may not be written to the NAND 10. In this case, however, the correction map 44 is not updated.

FIG. 17 is a diagram showing an example of the correction map 44 that has been updated. As shown in FIG. 17, the SSD controller 20 registers, as the moving destination location of the refresh target data, the physical address PA2 of the moving destination cluster so that the physical address PA2 is associated with the cluster ID 1 in the correction map 44 corresponding to the logical page 142-0.

The updating of the correction map 44 (particularly, updating in the case of writing data from the cluster refresh buffer 46 to the NAND 10) is performed on the basis of the cluster refresh buffer management table 47. After writing the refresh target data from the cluster refresh buffer 46 to the moving destination cluster in the NAND 10, before releasing the cluster refresh buffer 46, the SSD controller 20 first confirms that the reference flag corresponding to the buffer used for the moving of the refresh target data is 1. The reason to confirm the reference flag is as follows. There may be a situation in which the moving source logical block has already been recycled due to releasing before data that has come from the moving source is being written from the cluster refresh buffer 46 to the NAND 10. In such a race condition, an update operation intended to update the correction map 44 before recycling would update a correction map 44 after recycling, yielding an undesired result. If it is confirmed that the reference flag is 1, the SSD controller 20 identifies the logical page including the moving source cluster of the data based on the moving source location registered in the cluster refresh buffer management table 47, identifies the correction map 44 corresponding to the identified logical page, and updates the moving destination location of the corresponding entry in the identified correction map 44 to the physical address of the moving destination cluster in the NAND 10. The SSD controller 20 updates the logical block-correction map reference counter 45 corresponding to the logical block including the moving destination cluster in NAND 10. That is, the SSD controller 20 increments the number of clusters that have been moved from the outside of the logical block among the clusters in the logical block, in which data is written by the refresh in units of cluster. Further, if the reference flag corresponding to the area in which the data is stored in the cluster refresh buffer 46 is 1, the SSD controller 20 releases the area in which the data is stored in the cluster refresh buffer 46 according to the writing of the data stored in the cluster refresh buffer 46 to the moving destination cluster in the NAND 10.

FIG. 18 is a diagram showing an example of the address translation table 43 before and after the correction map 44 is updated as shown in FIG. 17. In this embodiment, as shown in FIG. 18, after the correction map 44 shown in FIG. 17 is updated, the SSD controller 20 maintains the physical address PA1 of the moving source cluster as the physical address corresponding to the LBA (0×21000) of the moving source cluster of the data subjected to the refresh in units of cluster. That is, the content of the address translation table 43 is the same before and after the correction map 44 is updated.

Figure 19:
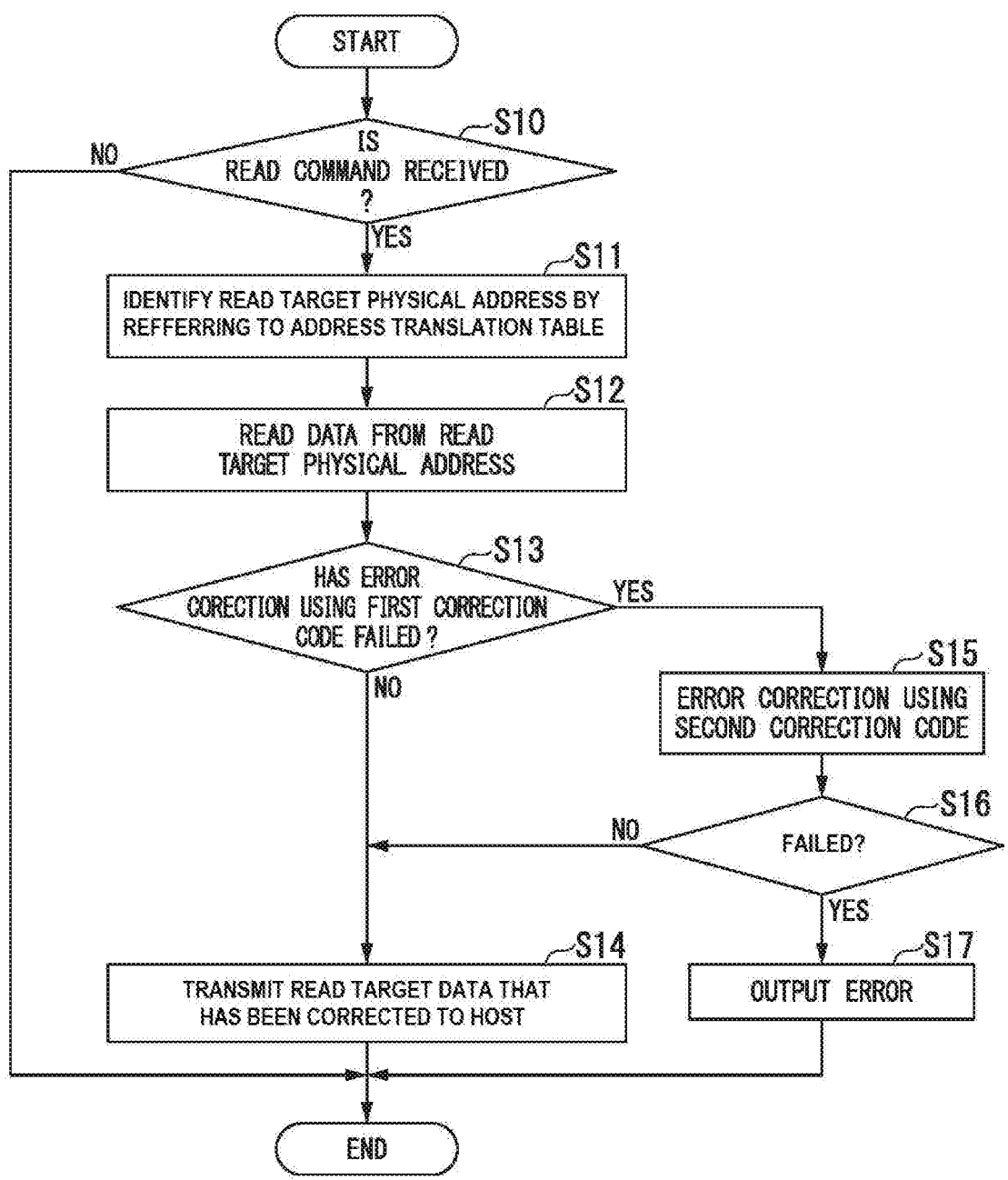
FIG. 19 is a flowchart showing a flow of a host read process.

The SSD controller 20 performs a data read process as follows. FIG. 19 is a flowchart showing an example of a flow of a host read process. The read command handled by the SSD controller 20 includes a logical address related to read target data.

First, the SSD controller 20 determines whether or not a read command has been received from the host 1000 (S10). At this time, when the read command has been transmitted from the host interface 30, the SSD controller 20 determines that the read command has been received. The SSD controller 20 ends the process of this flowchart if a read command from the host interface 30 is not received (NO in S10).

Next, the SSD controller 20 translates the logical address included in the read command into a physical address by referring to the address translation table 43, to obtain the physical address (read target physical address) at which the read target data is stored (S11). The SSD controller 20 reads the read target data from the obtained read target physical address and performs error correction on the read target data using the first correction code (S12). Next, the SSD controller 20 determines whether or not the error correction using the first correction code by the error correction processor 230 has failed at the time of reading of S12 (S13). If the error correction using the first correction code has not failed (has succeeded) (NO in S13), the read target data on which the error correction has been performed is transmitted to the host 1000 (S14).

If the error correction using the first correction code has failed (YES in S13), the SSD controller 20 performs the error correction on the read target data using group data of the clusters and the second correction code included in the error correction group 150 (S15). In this specification, such a process is referred to as "error correction using a second correction code." In this error correction process, if data included in the error correction group which includes the read target data has moved by the refresh in units of cluster, the data is acquired from the moving destination cluster obtained by referring to the correction map 44. The SSD controller 20 performs the error correction on the read target data using the data acquired from the moving destination cluster as a part of the data of the clusters included in the error correction group 150. Details of such a process will be described below with reference to FIGS. 21 to 23.

Next, the SSD controller 20 determines whether or not the error correction using the second correction code has failed (S16). If the error correction using the second correction code has not failed (has succeeded) (NO in S16), the corrected read target data is transmitted to the host 1000 (S14). On the other hand, if the error correction using the second correction code has failed (YES in S16), the SSD controller 20 outputs an error (S17). For example, the SSD controller 20 transmits an error response to the host 1000.

Figure 20:
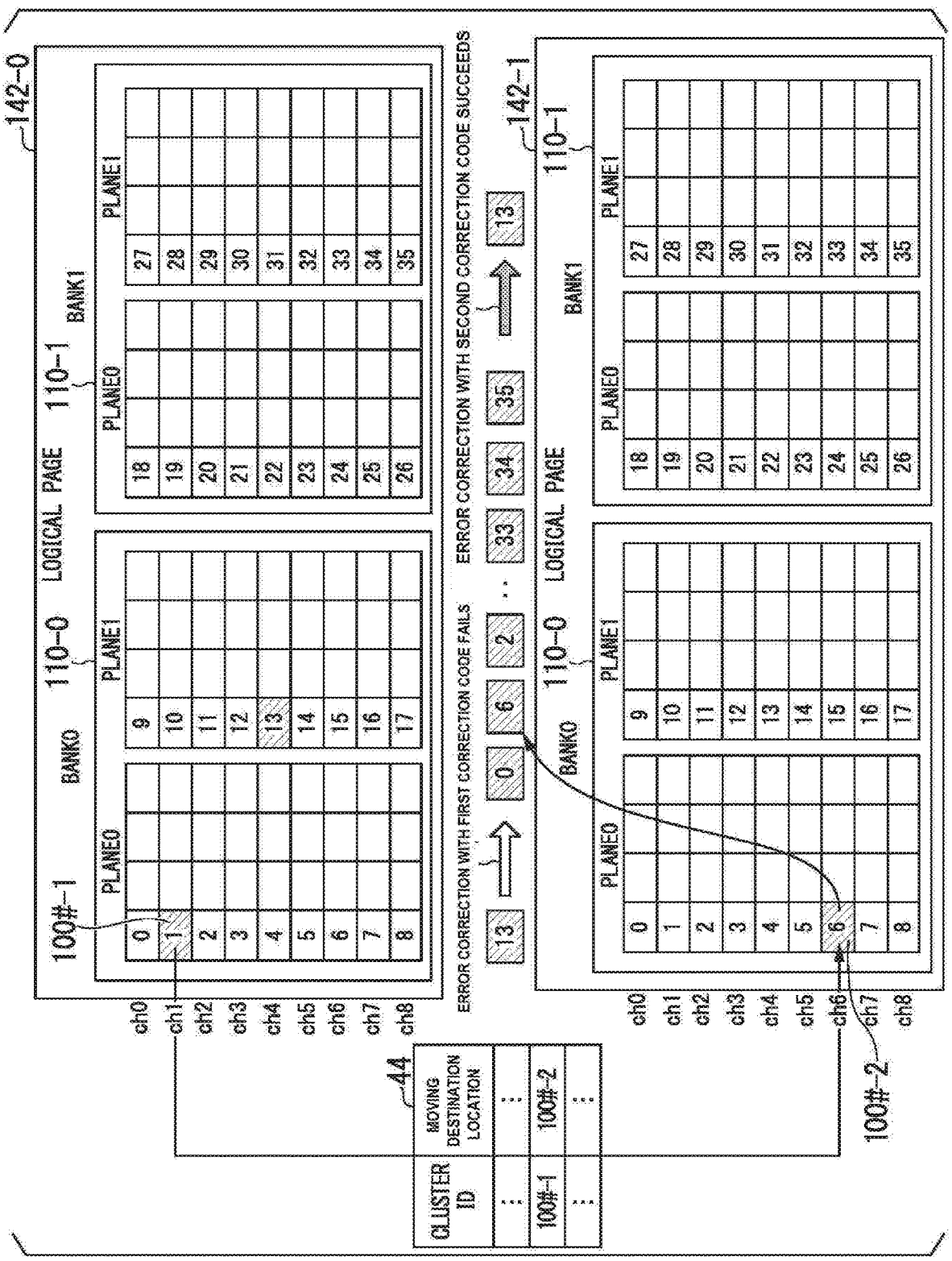
FIG. 20 is a diagram showing for explaining a process of error correction using a second correction code.

FIG. 20 is a diagram showing a process of the error correction using the second correction code in the embodiment. The storage device 1 is assumed to read cluster data (13) from the cluster 100(13) denoted by number "13" among the clusters 100 included in the logical page 142-0 on the basis of, for example, a read command. If the error correction using the first correction code 100b on the cluster data (13) of the logical page 142-0 has failed, the error correction processor 230 reads cluster data from each of a cluster 100(0), clusters 100(2) to 100(12), and clusters 100(14) to 100(33) of the logical page 142-0 denoted by numbers "0," "2" to "12," and "14" to "33" and a moving destination cluster 100#-2 in the logical page 142-1 obtained by referring to the moving destination location corresponding to the moving source cluster 100#-1 in the correction map 44 instead of the moving source cluster 100#-1. Further, the error correction processor 230 reads the second correction code 150b from clusters 100(34) and 100(35) denoted by numbers "34" and "35" of the logical page 142-0. "Referring to the moving destination location corresponding to the moving source cluster 100#-1 in the correction map 44" means finding a final moving destination location that is reachable by following one or more the correction maps 44 as shown in FIG. 7.

That is, the error correction processor 230 performs the error correction using the second error correction code 150b on the cluster data (13) of the logical page 142-0 using the cluster data (6) read from the logical page 142-1, the cluster data (0), cluster data (2) to (12), and cluster data (14) to (33) and the second correction code 150b in clusters (34) and (35) read from the logical page 142-0.

Figure 21:
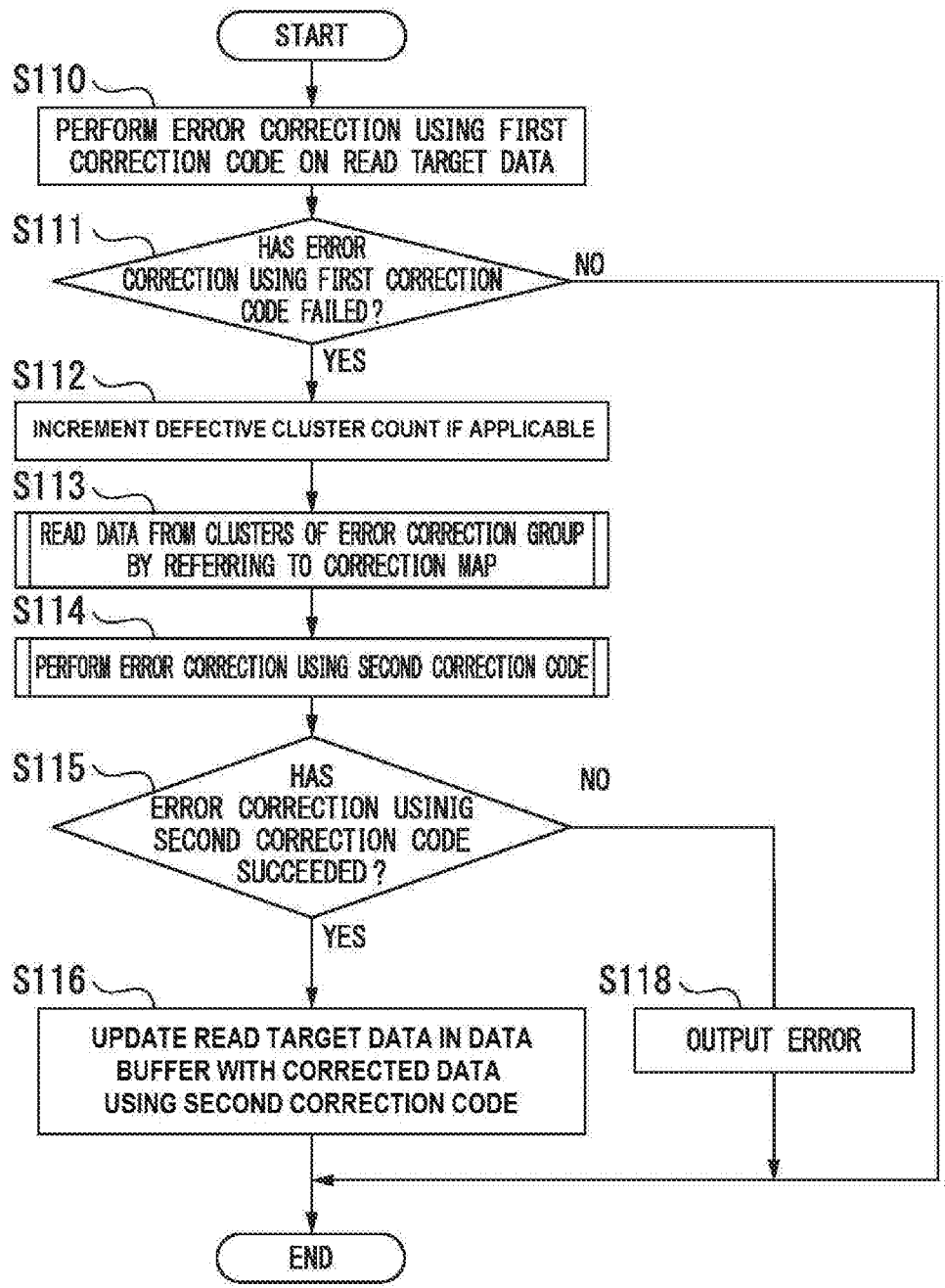
FIG. 21 is a flowchart showing, in details, a part of a read process flow of the storage device.

Hereinafter, various operations in the storage device 1 of the embodiment will be described. FIG. 21 is a flowchart of a read process in the storage device 1 of the embodiment. FIG. 21 shows, for example, the process of S13, S15, S16, and S17 in FIG. 19 in detail. Here, the process shown in FIG. 21 is not limited to the case of the host read and may be similarly applied to the case of garbage collection or the like. That is, "reading" in the following description means reading of data from the NAND 10 performed in the host read, garbage collection, refresh, or the like.

As shown in FIG. 21, the SSD controller 20 performs the error correction using the first correction code 100b on the read target data (S110).

Next, the SSD controller 20 determines whether or not the error correction using the first correction code 100b on the read target data has failed (S111). If the error correction using the first correction code 100b has failed (YES in S111), the SSD controller 20 increments the number of defective clusters of the logical block 140 to which the cluster 100 of the read target physical address belongs if applicable (S112). This process is described above with reference to FIG. 4.

Next, the SSD controller 20 performs the error correction using the second correction code 150b on the read target data. Specifically, the SSD controller 20 reads group data 150a from clusters included in the error correction group 150 that includes the cluster 100 of the read target physical address by referring to the correction map 44 (S113). Further, as a part of the process of S113, the SSD controller 20 reads the second correction code 150b from the clusters in which the second correction code 150b in the error correction group 150 including the cluster 100 of the read target physical address is stored. Here, a case will be described as an example in this embodiment, in which reading the entire cluster data (a set of the data 100a and the first correction code 100b) from each cluster is performed as the reading of the group data 150a and the second correction code 150b in the process of S113. However, for example, when error correction is performed through erasure correction, in the reading of the group data 150a and the second correction code 150b, reading may be performed only for the data 100a from each cluster, without reading the first correction code 100b. Note that the process of S113 will be described in detail below with reference to FIG. 22.

Next, the SSD controller 20 performs the error correction using the group data 150a and the second correction code 150b included in the error correction group 150 read in S113 (S114). The detailed process of S114 will be described below.

Next, the SSD controller 20 determines whether or not the error correction using the second correction code 150b has succeeded (S115). If the error correction has succeeded (YES in S115), the SSD controller 20 updates the read target data stored in the data buffer 41 to corrected data (S116). That is, the SSD controller 20 overwrites, on the data buffer 41, the read target data on which the error correction using the first correction code has failed with the data that has been corrected by the error correction using the second correction code. If the error correction using the first correction code has not failed (has succeeded) (NO in S111), the read process ends. If the error correction using the second correction code has failed (NO in S115), the SSD controller 20 outputs an error (S118).

Figure 22:
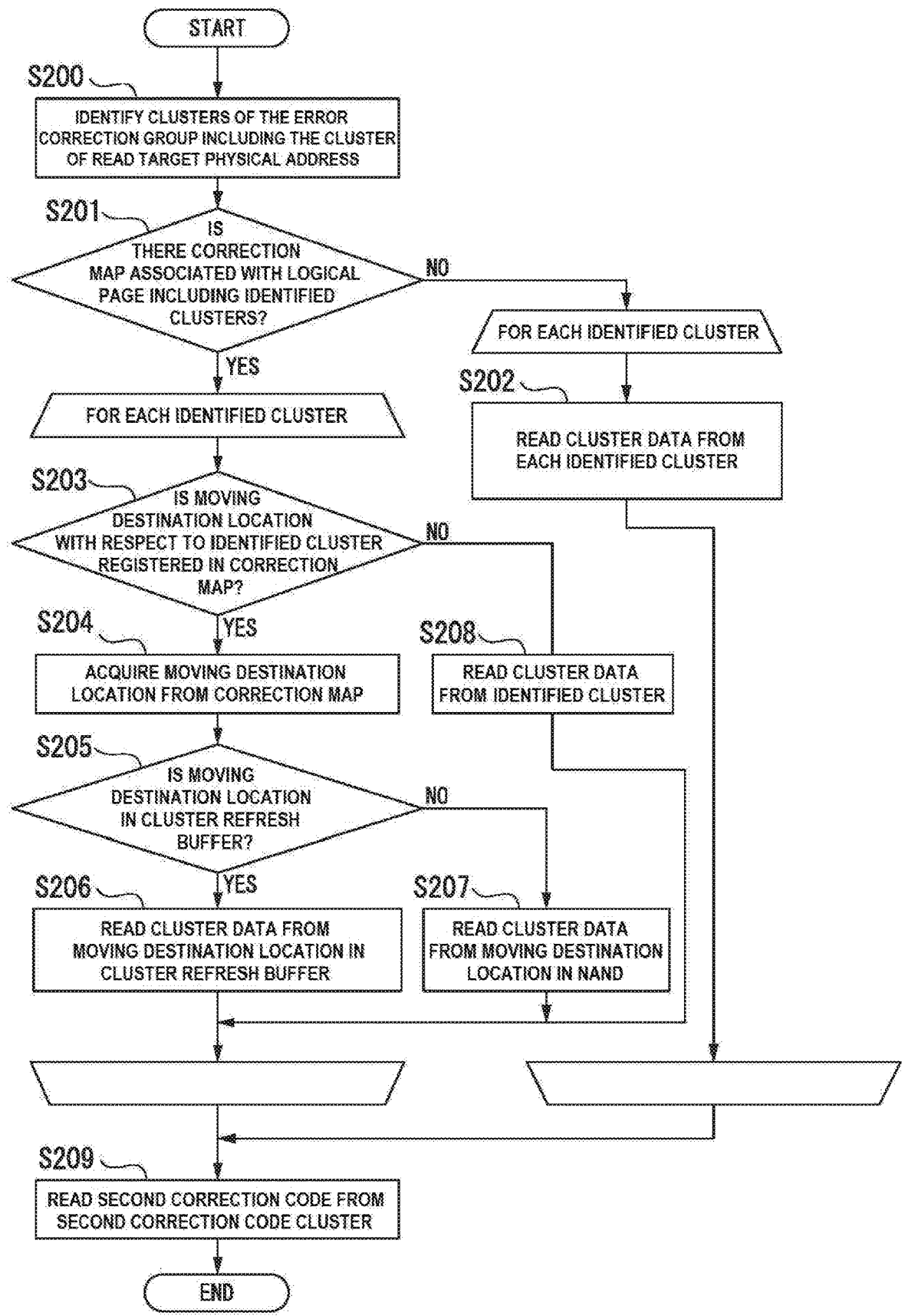
FIG. 22 is a flowchart showing an example of a process of reading data from clusters of the error correction group.

A process (the process of S113 in FIG. 21) of acquiring the group data 150a and the second correction code 150b from each of the clusters 100 in the error correction group 150 will be described below with reference to FIG. 22. FIG. 22 is a flowchart showing an example of reading the group data 150a and the second correction code 150b from each of the clusters 100 in the error correction group 150. First, the SSD controller 20 identifies the clusters included in the error correction group which includes the cluster of the read target physical address (S200). In the example of FIG. 12, the SSD controller 20 identifies, as the clusters included in the error correction group 150, one or more clusters which are included in either PLANE0 or PLANE1 (the same PLANE as the cluster of the read target physical address) in each of BANK0 and BANK1 of the logical pages 142 including the cluster of the read target physical address and with which intra-PLANE offsets (0 to 3) are the same as the cluster of the read target physical address. These clusters include identified clusters in which the group data 150a is stored and two clusters (hereinafter referred to as "second correction code clusters") in which the second correction code 150b is stored. Note that the "clusters" mentioned herein means the clusters identified in a state before referring to the correction map 44.

Next, the SSD controller 20 determines whether or not there is the correction map 44 associated with the logical page 142 including the identified clusters (S201). At this time, the SSD controller 20 refers to the correction map list 42a using the logical block ID and the logical page ID corresponding to a identified cluster included in the identified clusters. The SSD controller 20 determines whether or not there is a pointer for the correction map 44 corresponding to the logical page 142 in the correction map list 42a which has been referred to. Here, S201 is only the confirmation of the presence of the correction map 44 for the logical page 142, and in S201, the presence or absence of moving and a moving destination of data in each cluster of the error correction group 150 are not determined.

If there is no correction map 44 associated with the logical page 142 including the identified clusters (NO in S201), the SSD controller 20 reads cluster data (here, data that is a part of the group data 150*a*) from each identified cluster included in the identified clusters (S202). To be specific, SSD controller 20 causes the NAND controller 50 to send a read request from the NAND controller 50 to the NAND 10, the read request including the physical address corresponding to each identified cluster of the identified clusters. Thereby, the SSD controller 20 reads data stored in each identified cluster from the NAND 10 and stores it in the data buffer 41*b*.

On the other hand, in the case of YES in S201, the SSD controller 20 performs the processes of S203 to S208 on each identified cluster of the identified clusters identified in S200. Specifically, the SSD controller 20 determines whether or not the moving destination location with respect to the identified cluster is registered in the correction map 44 (S203). To be specific, the read/write controller 210 determines whether or not the moving destination location corresponding to the cluster ID of the identified cluster is registered in the correction map 44. The fact that the moving destination location with respect to the identified cluster is registered in the correction map 44 (which is not null) means that, as a result of performing the refresh in units of cluster, the cluster data of the identified cluster has been written to the cluster at the moving destination location, that is, the data has been moved.

If the moving destination location with respect to the identified cluster is registered in the correction map 44 (YES in S203), the SSD controller 20 acquires the moving destination location corresponding to the cluster ID of the identified cluster from the correction map 44 (S204). That is, the SSD controller 20 acquires the physical address indicated as the moving destination location from the correction map 44.

Next, the SSD controller 20 determines whether or not the moving destination location is a location in the cluster refresh buffer 46 based on the acquired physical address (S205). If the moving destination location is a location in the cluster refresh buffer 46, that is, if the refresh target data by the refresh in units of cluster has been stored in the refresh buffer 46 without having been yet written to the NAND 10 (YES in S205), the SSD controller 20 reads data (data which is a part of the group data 150*a*) stored in the cluster refresh buffer 46 to the data buffer 41 (S206). That is, the SSD controller 20 reads the refresh target data from the position in the cluster refresh buffer 46 which is the moving destination location. On the other hand, if the acquired physical address is not a location in the cluster refresh buffer 46 (NO in S205), the SSD controller 20 reads data (data which is a part of the group data 150*a*) stored in the moving destination cluster 100 in the NAND 10 which is indicated by the moving destination location (S207).

If the moving destination location with respect to the identified cluster is not registered in the correction map 44 (NO in S203), the SSD controller 20 reads the cluster data (data which is a part of the group data 150*a*) stored in the identified cluster to the data buffer 41 (S208).

Next, the SSD controller 20 reads the second correction code 150*b* from two second correction code clusters identified in the process of S200 (S209). To be specific, the SSD controller 20 causes the NAND controller 50 to send a read request from the NAND controller 50 to the NAND 10, the read request including physical addresses corresponding to the second correction code clusters. Thus, the SSD controller 20 reads the second correction code 150*b* stored in the second correction code clusters from the NAND 10 and stores the second correction code 150*b* in the data buffer 41. Note that, in this embodiment, it is premised that the second correction code 150*b* stored in the NAND 10 cannot be overwritten without erasing, and the second correction code 150*b* itself is not moved by the refresh in units of cluster. For this reason, confirmation of the correction map 44 for the second correction code 150*b* is unnecessary.

Figure 23:
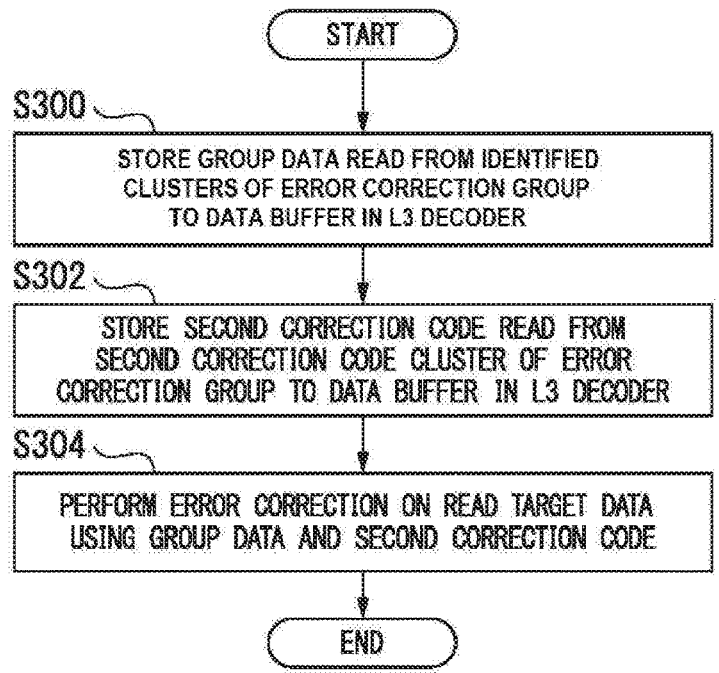
FIG. 23 is a flowchart showing an example of a process of performing error correction on data using the second correction code, for which error correction using a first correction code has failed.

A process (the process of S114 in FIG. 21) of performing the error correction using the second correction code 150*b* on data for which the error correction using the first correction code has failed will be described below with reference to FIG. 23. FIG. 23 is a flowchart showing an example of a process of performing error correction on the read target data using the second correction code in the storage device 1 according to the embodiment. Note that, in the following description, "identified clusters" means that, if the moving destination location with respect to the identified cluster is registered in the correction map 44 (in the case of YES in S203), the moving destination location of the refresh target data (the location in the cluster refresh buffer 46 or the moving destination cluster of the NAND 10) is included instead of the moving source cluster in the identified clusters of the error correction group 150.

First, the SSD controller 20 stores, in the L3 decoder 230*b*, the group data 150*a* (plural cluster data) that is read from each identified cluster 100 of the identified clusters of the error correction group 150 including the read target data to the data buffer 41 (S300). Similarly, the SSD controller 20 stores, in the L3 decoder 230*b*, the second correction code 150*b* that is read from the second correction code clusters of the error correction group 150 including the read target data to the data buffer 41 (S302).

The L3 decoder 230*b* of the SSD controller 20 performs the error correction using the second error correction code on the read target data using all of the group data 150*a* and the second correction code 150*b* that have been acquired (S304). At this time, for example, the L3 decoder 230*b* executes decoding using an RS code, but the embodiment is not limited thereto.

Figure 24:
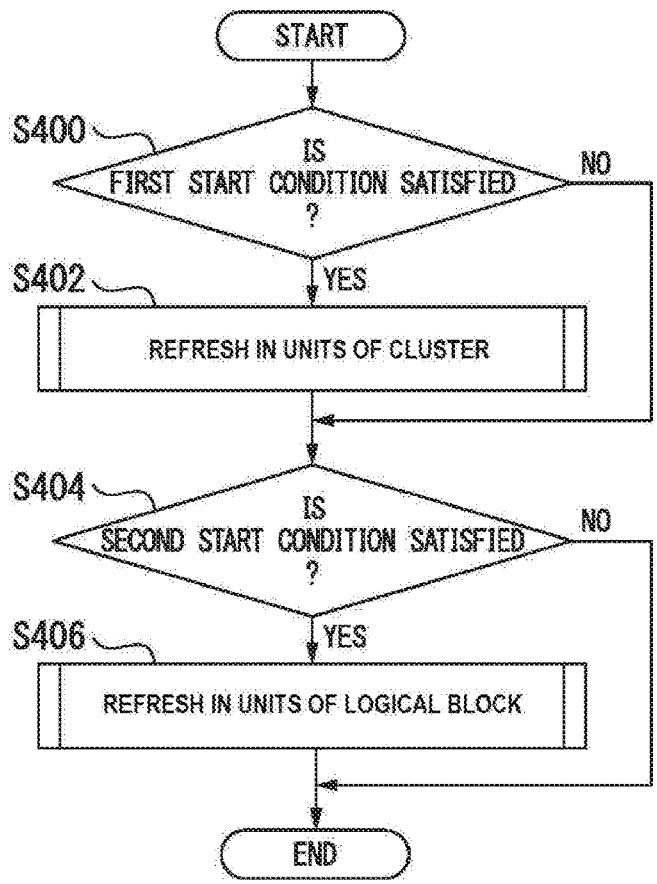
FIG. 24 is a flowchart showing an example of a flow of a refresh.

The refresh of the NAND 10 will be described below. FIG. 24 is a flowchart showing an example of a flow of a refresh.

The refresh determiner 244*a* determines whether or not a first start condition is satisfied (S400). The first start condition is a condition for executing the refresh in units of cluster. The first start condition includes that the error correction using the first correction code 100*b* has failed and the error correction using the second correction code 150*b* has succeeded when the cluster data has been read from the cluster 100, for example. Specifically, if the process of S116 in FIG. 21 has been performed, it is determined that the first start condition is satisfied. Note that, the first start condition may be that the estimation value of a read disturb stress acting on a certain cluster is higher than a predetermined threshold value, for example.

If the first start condition is satisfied (YES in S400), the cluster processor 244*b* executes the refresh in units of cluster (S402).

If the first start condition is not satisfied (NO in S400) or after the process of S402 has been executed, the refresh determiner 244*a* determines whether or not a second start condition is satisfied (S404). The second start condition is a condition for executing the refresh in units of logical block. The second start condition is that the number of defective clusters exceeds a first upper limit value in a logical block.

For example, the refresh determiner 244a refers to the number of defective clusters in the block management table 42 (FIG. 3A) and determines whether or not the second start condition is satisfied. The refresh determiner 244a may determine by referring to the number of times that the refresh in units of cluster has been performed, instead of the number of defective clusters. The second start condition may include, for example, at least one of: that a time greater than or equal to a threshold value has elapsed after writing of data; that the number of times of reading exceeds a threshold value; and that an error rate exceeds a threshold value. Further, the second start condition for performing refresh in units of logical block may include that an amount of data of the correction map 44 exceeds a threshold value.

If the second start condition is satisfied (YES in S404), the block processor 244c executes the refresh in units of logical block (S406). If the second start condition is not satisfied (NO in S404) or after the process of S406 has been executed, the process of the flowchart of FIG. 24 is terminated.

The refresh in units of cluster (the process of S402 in FIG. 24) will be described below. Here, a process for registering the moving destination location of the refresh target data for refresh in units of cluster in the correction map 44 that is related to the logical pages 142 including the moving source cluster of the refresh target data for the refresh in units of cluster will be described. Further, a case in which another data is stored in the cluster refresh buffer 46 before the refresh target data for the refresh in units of cluster is stored in the cluster refresh buffer 46 will be described by way of example.

Figure 25:
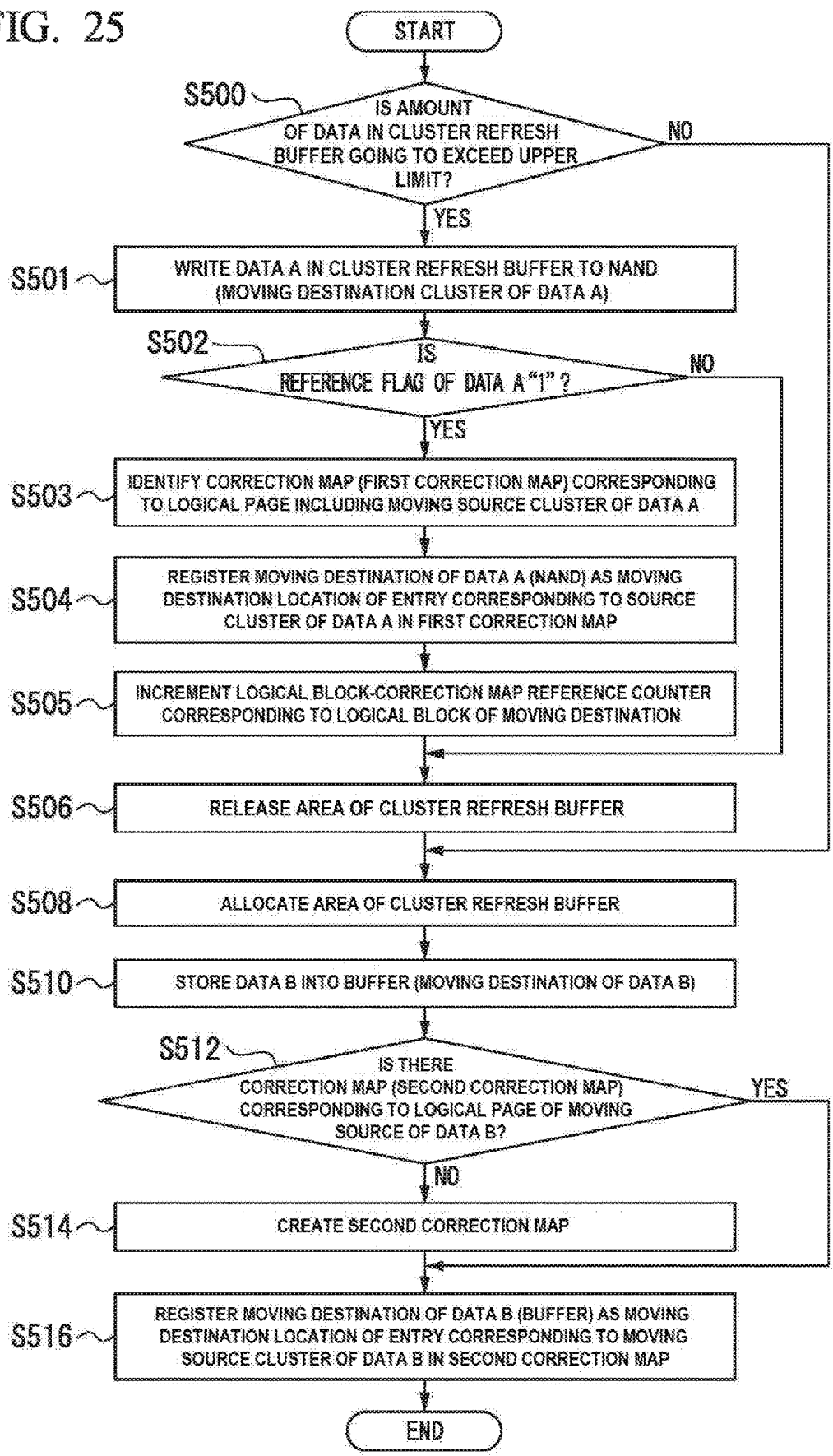
FIG. 25 is a flowchart showing an example of the refresh in units of cluster.

FIG. 25 is a flowchart showing an example of the refresh in units of cluster. Basically, the cluster processor 244b first reads the refresh target data from the NAND 10 and stores the refresh target data in the cluster refresh buffer 46 in the memory 40, and then reads the refresh target data in the cluster refresh buffer 46 and writes the refresh target data to the write destination block in the NAND 10. Further, the cluster processor 244b updates the correction map list 42a, the correction map 44, the cluster refresh buffer management table 47, and the like in association with execution of the refresh in units of cluster. For example, the cluster processor 244b registers the physical address of the cluster refresh buffer 46 in which the refresh target data is stored at the moving destination location in the correction map 44 corresponding to the moving source cluster of the refresh target data when the refresh target data has been stored in the cluster refresh buffer 46. After that, the cluster processor 244b registers the physical address of the moving destination cluster in the NAND 10 in which the refresh target data has been written at the moving destination location in the correction map 44 corresponding to the moving source cluster of the refresh target data when the refresh target data has been written to the NAND 10. The following description will be provided based on this premise.

First, when the refresh target data ("data B" described later) is to be stored in the cluster refresh buffer 46, the cluster processor 244b determines whether or not an amount of data stored in the cluster refresh buffer 46 is going to exceed an upper limit value if the refresh target data is stored (S500). If the amount of data stored in the cluster refresh buffer 46 is not going to exceed the upper limit value (NO in S500), the cluster processor 244b allocates an area of the cluster refresh buffer 46 (S508). As a result, an area for the refresh target data is allocated.

If the amount of data stored in the cluster refresh buffer 46 is going to exceed the upper limit value (YES in S500), the cluster processor 244b writes data that has been stored already in the cluster refresh buffer 46 (in the following, referred as to "data A" for convenience of description) into an available page in the write destination block in the NAND 10 (S501). For example, the cluster processor 244b selects the oldest clusters (clusters whose elapsed time from the storing of data in the cluster refresh buffer 46 is longest) in the cluster refresh buffer 46 as an evict target from the buffer 46 and instructs the NAND controller 50 to write the data in the selected clusters to the NAND 10. Note that, in the cluster refresh buffer management table 47, if the reference flag of the entry corresponding to the area in which the data A is stored in the cluster refresh buffer 46, is set as 0, the area of the cluster refresh buffer 46 may be released without writing the data A to the NAND 10.

The cluster processor 244b confirms whether or not the reference flag, in the cluster refresh buffer management table 47, of the entry corresponding to the area in which the data A is stored in the cluster refresh buffer 46, is set as 1, after writing the data from the cluster refresh buffer 46 to the moving destination cluster of the data A in the NAND 10 (S502). If the reference flag is 1 (YES in S502), the cluster processor 244b identifies the logical page including the moving source cluster of the data A based on the moving source location in the cluster refresh buffer management table 47 and identifies the correction map 44 corresponding to the identified logical page (hereinafter referred to as a "first correction map 44") (S503). The cluster processor 244b updates the moving destination location in the first correction map 44 corresponding to the cluster ID of the moving source cluster of the data A to the physical address of the moving destination cluster of the data A in the NAND 10 (S504).

Next, if the logical block 140 including the moving destination cluster of the data A is different from the logical block 140 including the moving source of the data A, the cluster processor 244b increments a value of the logical block-correction map reference counter 45 corresponding to the logical block 140 including the moving destination cluster of the data A (S505).

Next, the cluster processor 244b releases the area in which the data A had been stored in the cluster refresh buffer 46 (S506). Here, the cluster processor 244b changes, in the cluster refresh buffer management table 47, the entry indicating the state of the area in which the data A had been stored in the cluster refresh buffer 46, to "unused."

On the other hand, if the reference flag is 0 (NO in S502), the cluster processor 244b releases the area in which the data A had been stored in the cluster refresh buffer 46 without updating the first correction map 44 (S506). Here, the cluster processor 244b changes, in the cluster refresh buffer management table 47, the entry indicating the state of the area in which the data A had been stored in the cluster refresh buffer 46, to "unused."

Since an available area is made in the cluster refresh buffer 46 in the above-described process, the refresh in units of cluster for data (hereinafter referred to as "data B" for convenience of description), which is different from the data A, as a target may be started. The cluster processor 244b allocates an area in the cluster refresh buffer 46 for storing the data B that is a target for the refresh in units of cluster (S508). To be specific, the cluster processor 244b changes, in the cluster refresh buffer management table 47, the entry indicating the state of the area in which the data B is to be stored in the cluster refresh buffer 46, to "in use", thereby allocating the cluster refresh buffer 46. At this time, the cluster processor 244b may allocate the area for storing the data B in the cluster refresh buffer 46, for example, by allocating the area released in the process of S506.

Next, the cluster processor 244*b* stores the data B in the moving destination location in the cluster refresh buffer 46 (S510). The cluster processor 244*b* updates the content of the cluster refresh buffer management table 47. For example, the cluster processor 244*b* sets the physical address of the moving source cluster of the refresh target data for the corresponding entry in the cluster refresh buffer management table 47 and sets "1" for the reference flag in the cluster refresh buffer management table 47, respectively.

Next, the cluster processor 244*b* determines whether or not there is the correction map 44 associated with the logical page including the moving source cluster of the data B (hereinafter, referred to as "the second correction map 44") (S512).

If there is no correction map 44 associated with the logical page including the moving source cluster of the data B (NO in S512), the cluster processor 244*b* generates (creates) a second correction map 44 (S514). At this time, the cluster processor 244*b* generates an empty second correction map 44 for the logical page 142. The empty second correction map 44 means a correction map in which all the moving destination locations corresponding to all the clusters are in a null state. When generating the correction map 44 related to the logical block for the first time (i.e., when the correction map information of the entry corresponding to the logical block in the block management table 42 indicates null), the cluster processor 244*b* generates a correction map entry which includes a pointer for the generated correction map 44 and including null as a "pointer for the next correction map entry" and sets a pointer for the generated correction map entry in the correction map information. If one or more correction maps 44 are linked to the logical block in advance, the cluster processor 244*b* similarly generates a correction map entry and sets a pointer for the generated correction map entry to "the pointer for the next correction map entry" of the entry at the end of the correction map list indicated in the correction map information of the entry corresponding to the logical block. On the other hand, if there is a second correction map 44 related to the logical pages 142 of the moving source (YES in S512), the cluster processor 244*b* advances the process to S516.

The cluster processor 244*b* registers the moving destination location of the data B in the second correction map 44 (S516). The cluster processor 244*b* registers the physical address at which the data B is stored in the cluster refresh buffer 46 as the moving destination location of the data B in the correction map 44. Further, if the logical block including the moving source cluster of the data B is released, the cluster processor 244*b* sets, in the cluster refresh buffer management table 47, the reference flag of the entry corresponding to the area in which the data B is stored in the cluster refresh buffer 46, to "0".

According to such refresh in units of cluster, the refreshed data is stored in the order of the cluster refresh buffer 46 and the NAND 10. The destination of the data stored to the cluster refresh buffer 46 and the destination of the data written to the NAND 10 (storage destination in the case of the buffer) are reflected in the correction map 44 in order. Thus, it is possible to dynamically change the clusters constituting the error correction group 150.

[Refresh in Units of Logical Block]

Figure 26:
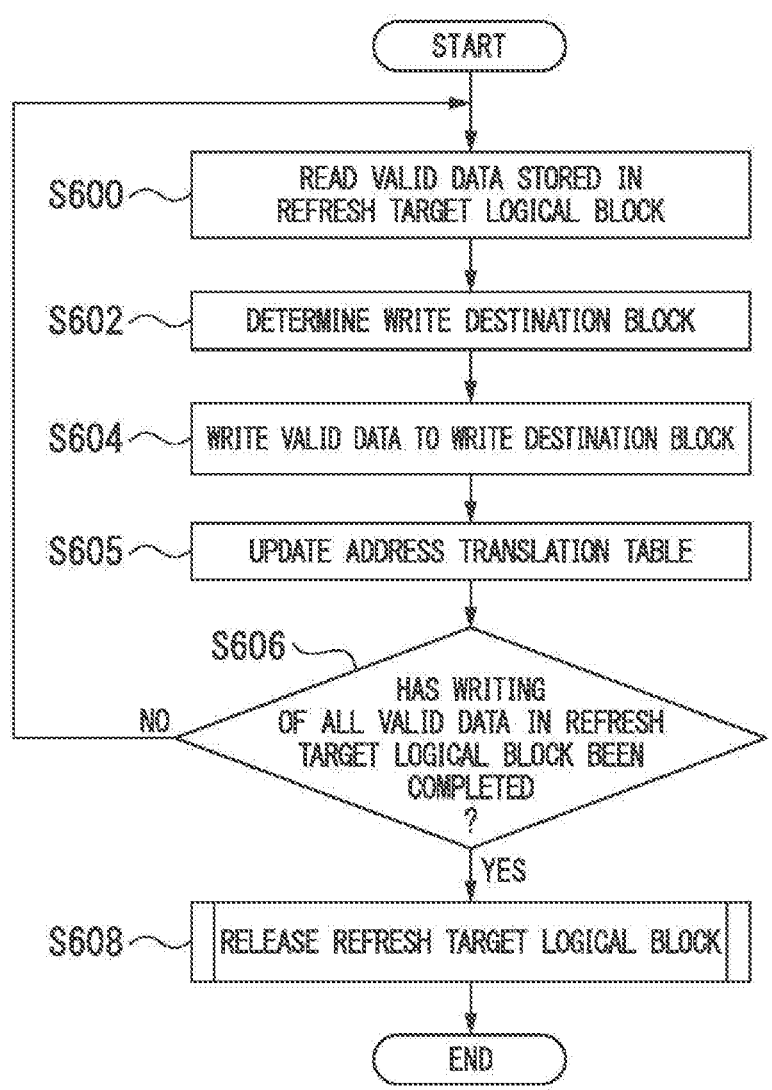
FIG. 26 is a flowchart showing an example of a refresh in units of logical block.

Hereinafter, the refresh in units of logical block (the process of S406 in FIG. 24) will be described. FIG. 26 is a flowchart showing an example of the refresh in units of logical block.

The refresh target logical block 140 is a logical block 140 determined to satisfy the second start condition in S404 of FIG. 24. First, the block processor 244*c* reads valid data stored in the refresh target logical block 140 (the logical block of moving source) (S600). The process of S600 will be described. First, the block processor 244*c* selects a cluster included in the refresh target logical block 140. Here, the physical address of the selected cluster is referred to as a "first physical address." Next, the block processor 244*c* refers to the write log related to the selected cluster and acquires the logical address of the cluster. Next, the block processor 244*c* refers to the address translation table 43 using the acquired logical address, and acquires a latest physical address (in the following, referred to as a "second physical address") corresponding to the logical address. The block processor 244*c* determines that the cluster is a valid cluster if the first physical address and the second physical address match, and determines that the cluster is an invalid cluster if the first physical address and the second physical address do not match. Then, the block processor 244*c* generates a set of physical addresses of valid clusters, and reads data from each physical address of the set of physical addresses. The block processor 244*c* stores the read valid data in the data buffer 41.

Next, the block processor 244*c* determines a write destination block (moving destination block) for the valid data read in S600 (S602). In this case, if there is a logical block 140 that may be further written, the block processor 244*c* sets the logical block 140 as the write destination block. On the other hand, if there is no logical block 140 that may be further written, the block processor 244*c* selects one logical block 140 among the free blocks by referring to the list of the free blocks, erases data in the selected logical block 140, and sets the selected logical block 140 as the write destination block.

Next, the block processor 244*c* writes the valid data to the write destination block (S604). At this time, the block processor 244*c* writes the valid data stored in the data buffer 41 to the write destination block in the NAND 10. The block processor 244*c* updates the address translation table 43 (S605). To be specific, given the logical address, the moving source physical address, and the moving destination physical address which are related to the valid data, the block processor 244*c* obtains the physical address (old physical address) corresponding to the logical address by referring to the address translation table 43. Further, the block processor 244*c* updates the address translation table 43 so that the moving destination physical address corresponds to the logical address only if the old physical address and the moving source physical address match. As described above, the block processor 244*c* updates the valid cluster counter according to the updating of the address translation table 43.

Next, the block processor 244*c* determines whether or not all the valid data in the refresh target logical block 140 has been written to the write target destination block (S606). If writing of all valid data has not been completed (NO in S606), the block processor 244*c* returns the process to S600.

If writing of all the valid data has been completed (YES in S606), the block processor 244*c* executes a process of releasing (including a determination process for release) the logical block 140 of the moving source (the refresh target physical block) (S608). Whether or not writing of all the valid data has been completed may be confirmed based on whether or not the value of the valid cluster counter for the logical block 140 of the moving source is 0. The process of releasing the logical block 140 will be described with reference to FIG. 27.

Here, the fact that the number of valid clusters of the logical block 140 is 0 means that the logical block 140 is not to be a target of a read based on a read command from the host 1000 or a read based on garbage collection. If the logical block 140 is not to be the target of the read, there is no need for the error correction using the second correction code 150*b* in the logical block 140. For this reason, there is no problem even if the correction map 44 is erased in the process of FIG. 27 to be described below.

Figure 27:
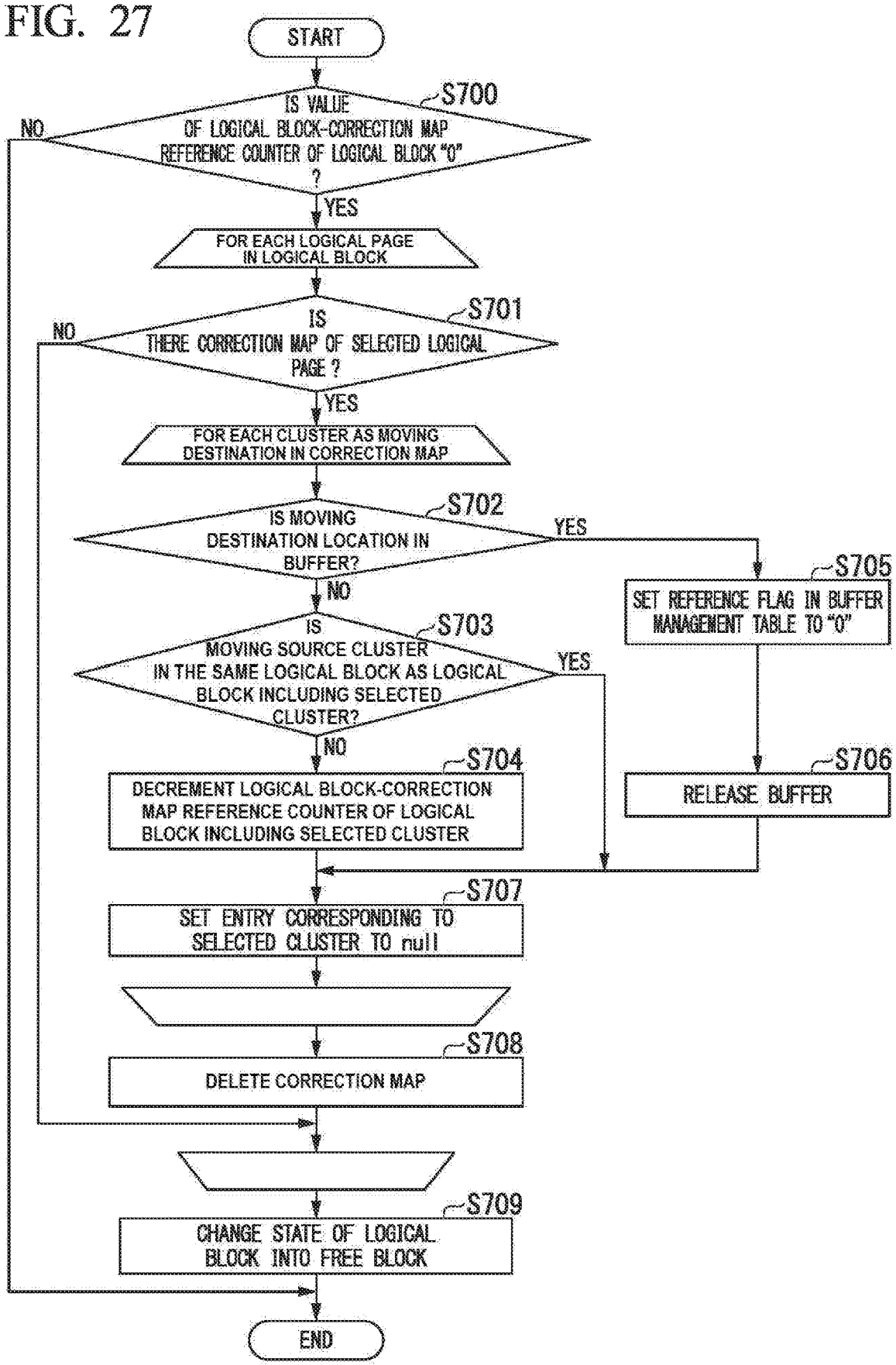
FIG. 27 is a flowchart showing an example of a process of releasing a logical block.

Hereinafter, the process of releasing the logical block 140 described in S608 of FIG. 26 will be described. FIG. 27 is a flowchart showing an example of the process of releasing the logical block 140 in the embodiment.

First, the block manager 240 determines whether or not the value of the logical block-correction map reference counter 45 of the target logical block 140 is 0 (S700). The fact that the value of the logical block-correction map reference counter 45 is 0 indicates that any one of the physical addresses of clusters 100 included in the logical block 140 is not registered as the moving destination location in the correction maps 44 that are for clusters (i.e., clusters of logical blocks other than the target logical block) other than the clusters included in the target logical block among all correction maps 44 in the storage device. If the value of the logical block-correction map reference counter 45 of the target logical block 140 is not 0 (NO in S700), the block manager 240 terminates the process. In this case, the target logical block 140 is not released. Thereby, it is possible to prevent the logical block 140 to be referred to as the moving destination location from the cluster in other logical block 140 from being released.

If the logical block-correction map reference counter 45 of the target logical block 140 is 0 (YES in S700), the block manager 240 performs the processes of S701 to S708 on every logical page 142 included in the logical block 140. Specifically, the block manager 240 first determines whether or not there is a correction map 44 corresponding to a logical page (hereinafter referred to as a "selected logical page") selected as the target of the processes of S701 to S708 (S701). If there is no correction map 44 corresponding to the selected logical page (NO in S701), the block manager 240 returns to the beginning of the iteration processes including S701 to S708 and selects the next logical page 142. Here, if all the logical pages 142 have already been selected, the process of this flowchart ends.

If there is the correction map 44 corresponding to the selected logical page (YES in S701), the block manager 240 performs the processes of S702 to S707 on every cluster registered as the moving destination location in the correction map 44 corresponding to the selected logical page. Specifically, the block manager 240 first determines whether or not the moving destination location of the data (hereinafter referred to as a "selected cluster", which is a cluster located at the moving destination) selected as the target of the processes of S702 to S707 is in the cluster refresh buffer 46 (S702). If the selected cluster (i.e., the moving destination location) is not in the cluster refresh buffer 46 (NO in S702), the block manager 240 determines whether or not the moving source cluster corresponding to the selected cluster is included in the same logical block as the selected cluster in the correction map 44 (S703). For example, the block manager 240 selects one entry in the correction map 44 and determines whether or not the moving source cluster (the cluster corresponding to the entry) corresponding to the selected cluster is included in the same logical block as the selected cluster on the basis of the moving source cluster (the cluster corresponding to the entry) and the selected cluster (i.e., the moving destination location of the entry). If the moving source cluster corresponding to the selected cluster is not included in the same logical block as the selected cluster (NO in S703), the block manager 240 decrements the logical block-correction map reference counter 45 of the logical block 140 including the selected cluster (S704).

On the other hand, if the moving source cluster corresponding to the selected cluster is included in the same logical block as the selected cluster (YES in S703), the block manager 240 does not execute the process of S704.

If the selected cluster (i.e., the moving destination location) is in the cluster refresh buffer 46 (YES in S702), the block manager 240 sets the reference flag in the buffer management table 47 corresponding to the area storing the data in the cluster refresh buffer 46 to 0 (S705). In this case, for example, the block manager 240 releases the cluster refresh buffer 46 without storing the data in the NAND 10 (S706). Note that the block manager 240 may release the cluster refresh buffer 46 after writing the data to the NAND 10.

Next, the block manager 240 sets the "moving destination location" of the entry in the correction map 44 corresponding to the selected cluster to null (S707).

The block manager 240 deletes the correction map 44 of the selected logical page after the process loop of S702 to S707 for every cluster registered as the moving destination location in the correction map 44 corresponding to the selected logical page has been completed and releases a memory area storing the correction map 44 (S708).

The block manager 240 changes the state of the target logical block 140 into the free block after the process loop of S701 to S708 for every logical page in the target logical block 140 has been completed (S709).

Also, the fact that the logical block-correction map reference counter 45 is 0 means that the logical block 140 is not referred to in the correction process using the second correction code 150*b* included in other logical blocks 140. If the logical block 140 is not referred to in the correction process using the second correction code 150*b* included in other logical blocks 140, the logical block 140 may be released.

If there is no necessity of error correction using the second correction code 150*b* in the logical block 140, the reference destination of the correction map 44 of the logical block 140 is not referred to. For this reason, the block manager 240 may decrement the logical block-correction map reference counter 45 of the logical block 140 of the moving destination location.

Several modifications of the embodiment will be described below. Note that, in each of the modifications, configurations other than those described below are the same as the configuration of the above-described embodiment.

(First Modification)

Figure 28:
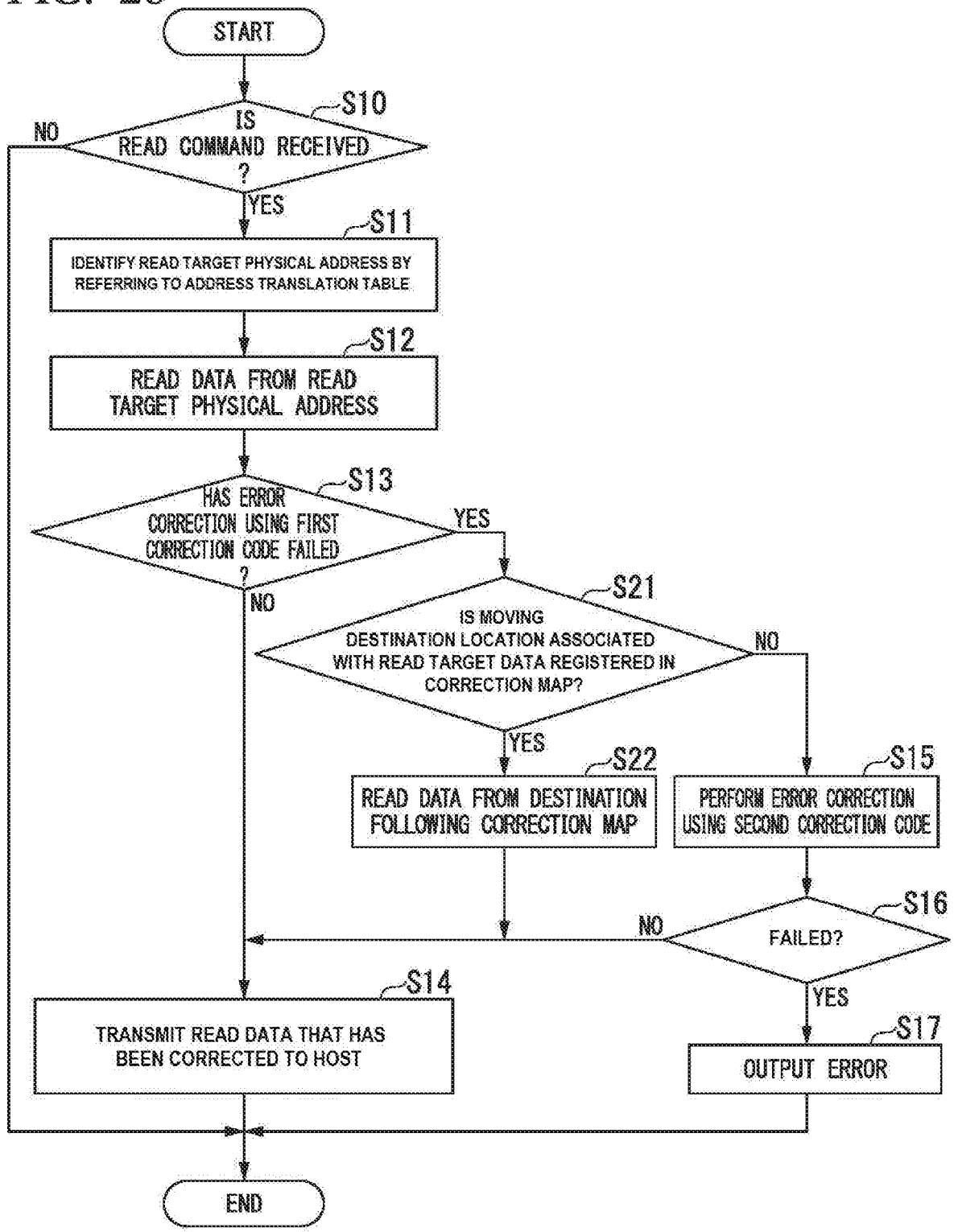
FIG. 28 is a flowchart showing an example of a flow of a host read process according to a first modification of the embodiment.

A first modification is an example in which, if error correction using a first correction code has failed, a correction map 44 is referred before error correction using a second correction code is performed. FIG. 28 is a flowchart showing an example of a flow of a host read process in the first modification. Note that explanations of the same parts as in FIG. 19 will be omitted.

In the first modification, if the error correction using the first correction code on read target data has failed (YES in S13), the SSD controller 20 determines, by referring to a correction map 44 of a logical page including a cluster in which the read target data is stored, whether or not a moving destination location of the read target data is registered to determine whether or not the read target data has already moved due to refresh in units of cluster (S21). To be specific, the SSD controller 20 determines whether or not the moving destination location of the read target data in an entry in the correction map 44 corresponding to a read target physical address of the read target data is null.

If the moving destination location of the read target data is registered in the correction map 44 (YES in S21), the SSD controller 20 reads the read target data from a final moving destination location of the read target data obtained by referring to the correction map 44 (S22). The data read from the final moving destination location of the read target data is data whose error has already been corrected by the error correction using the second correction code. For this reason, the SSD controller 20 may transmit the data read from the final moving destination location to a host 1000 without requiring further performing the error correction using the second correction code (S14).

On the other hand, if there is no registration indicating the moving destination location of the read target data in the correction map 44 (NO in S21), the SSD controller 20 performs the error correction using the second correction code as in the above-described embodiment (S15). The subsequent flow is the same as in the above-described embodiment.

(Second Modification)

Figure 29:
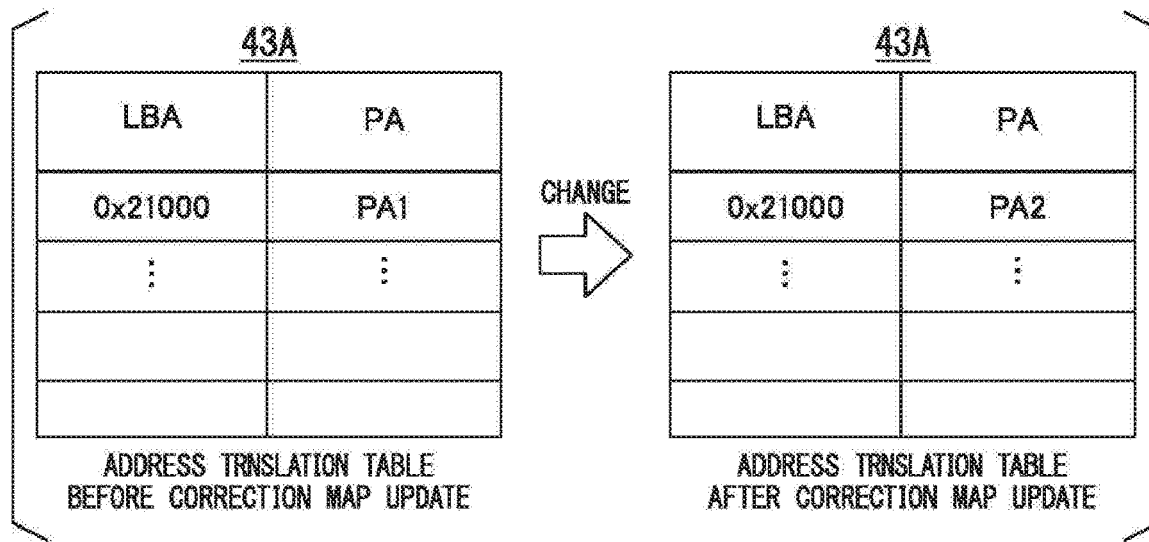
FIG. 29 is a diagram showing an example of address translation tables before and after a correction map is updated according to a second modification of the embodiment.

A second modification is an example in which, an address translation table 43A is updated in accordance with update of a correction map 44 in some cases. FIG. 29 is a diagram showing an example of the address translation table 43A before and after the correction map 44 is updated according to the second modification. In the second modification, when refresh in units of cluster is performed, the SSD controller 20 determines whether or not refresh target data subjected to the refresh in units of cluster is valid data. For example, the SSD controller 20 determines whether or not the refresh target data to be subjected to the refresh in units of cluster is valid data by referring to the address translation table 43A. For example, the SSD controller 20 determines whether or not the refresh target data subjected to the refresh in units of cluster is valid data on the basis of the same process as the process described in the description of S600 in FIG. 26 in the above-described embodiment.

Next, the SSD controller 20 updates the address translation table 43A only in the case where the read target data subjected to the refresh in units of cluster is a valid cluster. To be specific, as shown in FIG. 29, if the correction map 44A has been updated, the SSD controller 20 changes a physical address PA1 of a moving source cluster of the refresh target data subjected to the refresh in units of cluster to a physical address PA2 of the moving destination cluster of the refresh target data subjected to the refresh in units of cluster, as a physical address corresponding to an LBA (0×21000) of the refresh target data subjected to the refresh in units of cluster. This change is made in the case where the refresh target data subjected to the refresh in units of cluster is stored in a cluster refresh buffer 46 from the moving source cluster and in the case where the refresh target data subjected to the refresh in units of cluster is written from the cluster refresh buffer 46 to the moving destination cluster in the NAND 10. Further, when reading data moved through the refresh in units of cluster as the read target data, the SSD controller 20 finds the moving destination location of the data moved through the refresh in units of cluster on the basis of the address translation table 43A.

In the second modification, the SSD controller 20 does not release the cluster refresh buffer 46 until at least valid data in the cluster refresh buffer 46 is written to the NAND 10 even if a moving source logical block of the refresh target data subjected to the refresh in units of cluster is released. The reason for this is as follows. That is, when the address translation table 43A is updated after the refresh, the moving source cluster of the refresh target data is changed to an invalid cluster. As a result, the logical block including the refresh target cluster may be changed to be a free block. In this case, the reference flag of the cluster refresh buffer 46 is changed to 0, and valid data in the cluster refresh buffer 46 will be erased without being written to the NAND 10 in some cases. For this reason, while the data in the cluster refresh buffer 46 is referred from the address translation table 43A, it is necessary to write the data in the cluster refresh buffer 46 to the NAND 10 even if the reference flag has been changed to 0.

Here, even in the case of the second modification, the correction map 44 is not omitted. Error correction using a second correction code 150b is performed using the correction map 44, not using the address translation table 43A. This is because invalid data may be handled as cluster data of an error correction group 150 in the error correction using the second correction code 150b, whereas the address translation table 43A handles only valid data.

(Third Modification)

Figure 30:
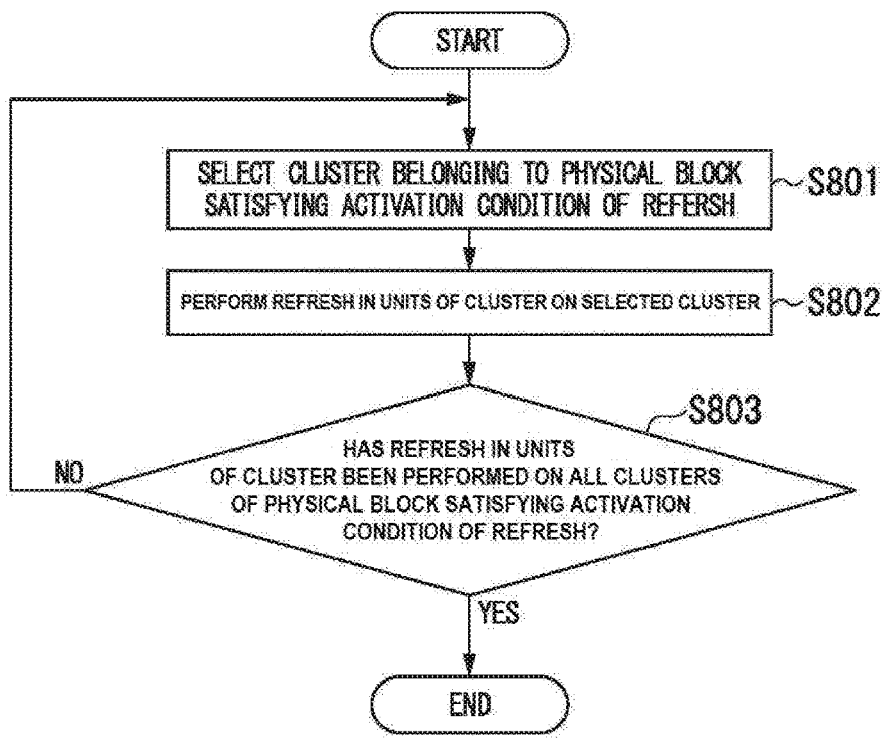
FIG. 30 is a flowchart showing an example of a flow of a refresh in units of physical block according to a third modification of the embodiment.

A third modification is an example in which refresh in units of cluster is performed on every cluster in a physical block, thereby performing refresh in units of physical block. FIG. 30 is a flowchart showing a flow of the refresh in units of physical block in the third modification. In the third modification, when a physical block satisfies an activation condition for the refresh in units of physical block, the SSD controller 20 selects the physical block satisfying the activation condition as a target and performs the refresh in units of cluster on every cluster in the selected physical block.

For example, the SSD controller 20 selects one cluster belonging to the physical block satisfying the activation condition for the refresh in units of physical block (S801). In the third modification, such a selected cluster is referred to as a "selected cluster." Further, the SSD controller 20 performs the refresh in units of cluster on the selected cluster (S802). Note that details of the refresh in units of cluster for the selected cluster are the same as the refresh in units of cluster in the above-described embodiment. In the third modification, a moving destination of data when the refresh in units of cluster is performed on the selected cluster is managed using the correction map 44.

Next, the SSD controller 20 determines whether or not the refresh in units of cluster has been performed on all the clusters belonging to the physical block satisfying the activation condition for the refresh in units of physical block (S803). Further, the SSD controller 20 repeats the processes of S801 to S803 until the refresh in units of cluster is performed on all the clusters (including invalid cluster) belonging to the physical block. Thus, the refresh in units of cluster is performed on all the clusters in the physical block and the refresh in units of physical block is performed.

According to such a process, when a burst error occurs in a physical block, since a refresh may be performed in units of physical block, a refresh process for data for which a refresh process is originally unnecessary is reduced as compared with when a refresh process is performed in units of logical block. Further, in the case where the error correction failure using the first correction code has not occurred yet (it has not reached a burst error yet) in most of the clusters in the physical block but a large number of defective clusters are predicted to occur in the near future (such as a read disturb counter overflow), the refresh in units of physical block may be performed as a preventive process. Thus, the above-described preventive process can be realized at a lower cost than the refresh in units of logical block.
(Fourth Modification)

Figure 31:
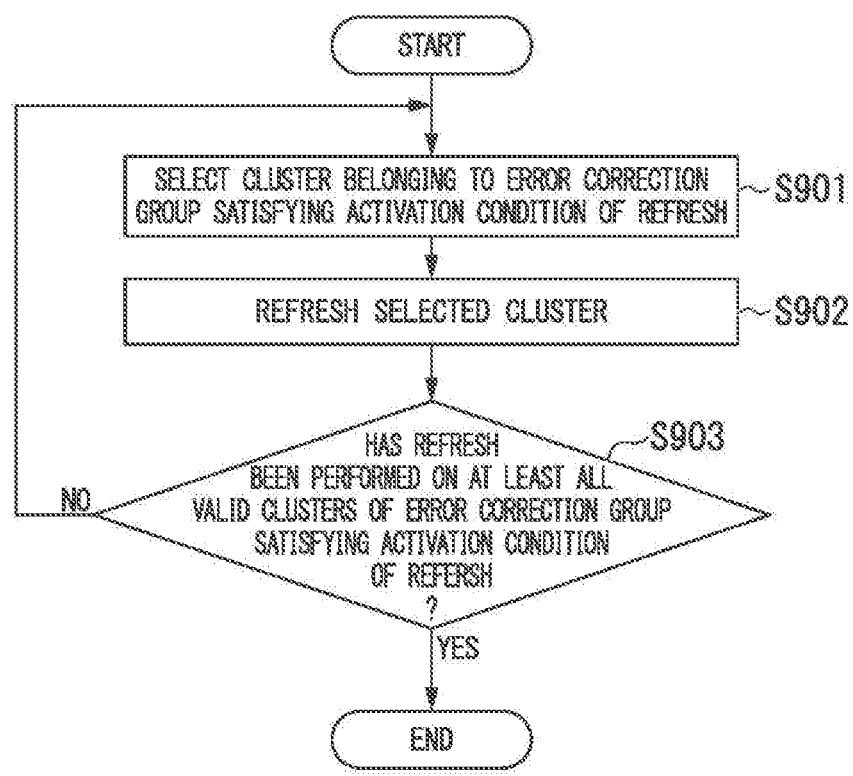
FIG. 31 is a flowchart showing an example of a flow of a refresh in units of error correction group according to a fourth modification of the embodiment.

A fourth modification is an example in which refresh in units of error correction group is performed. FIG. 31 is a flowchart showing a flow of the refresh in units of error correction group of the fourth modification. In the fourth modification, when an error correction group satisfies an activation condition for the refresh in units of error correction group, the SSD controller 20 selects the error correction group satisfying the activation condition as a target and performs the refresh process on at least all valid clusters in the selected error correction group.

For example, the SSD controller 20 selects a valid cluster included in the error correction group 150 satisfying the activation condition for the refresh in units of error correction group (S901). Further, the SSD controller 20 performs the refresh on the selected valid cluster (S902). Here, the refresh in units of error correction group of the fourth modification is a refresh involving update of an address translation table 43 rather than refresh in units of cluster involving a correction map 44. That is, this refresh in units of error correction group is performed without generating/updating the correction map 44, and a moving destination of refresh target data is managed using the address translation table 43.

Next, the SSD controller 20 determines whether or not the refresh process has been performed on all the valid cluster included in the error correction group satisfying the activation condition for the refresh in units of error correction group (S903). Further, the SSD controller 20 repeats the processes of S901 to S903 until the refresh is performed on all the valid cluster included in the error correction group. Thus, the refresh is performed on all the valid clusters in the error correction group and the refresh in units of error correction group is performed.

According to such a process, for example, when the error correction using the first correction code failure has not occurred yet (it has not been reached a burst error yet) in most of the clusters in the error correction group but a large number of defective clusters are predicted to occur in the near future (e.g., when reliability variation among physical pages constituting a physical block is large and reliability variation among physical pages constituting a logical page is small), the refresh in units of error correction group may be performed as a preventive process. Thus, the above-described preventive process can be realized at a lower cost than the refresh in units of logical block.

Note that a refresh unit may be a logical page unit instead of an error correction group unit. Such refresh in units of logical page is a refresh involving the address translation table 43 rather than refresh in units of cluster involving the correction map 44.
(Fifth Modification)

Figure 32:
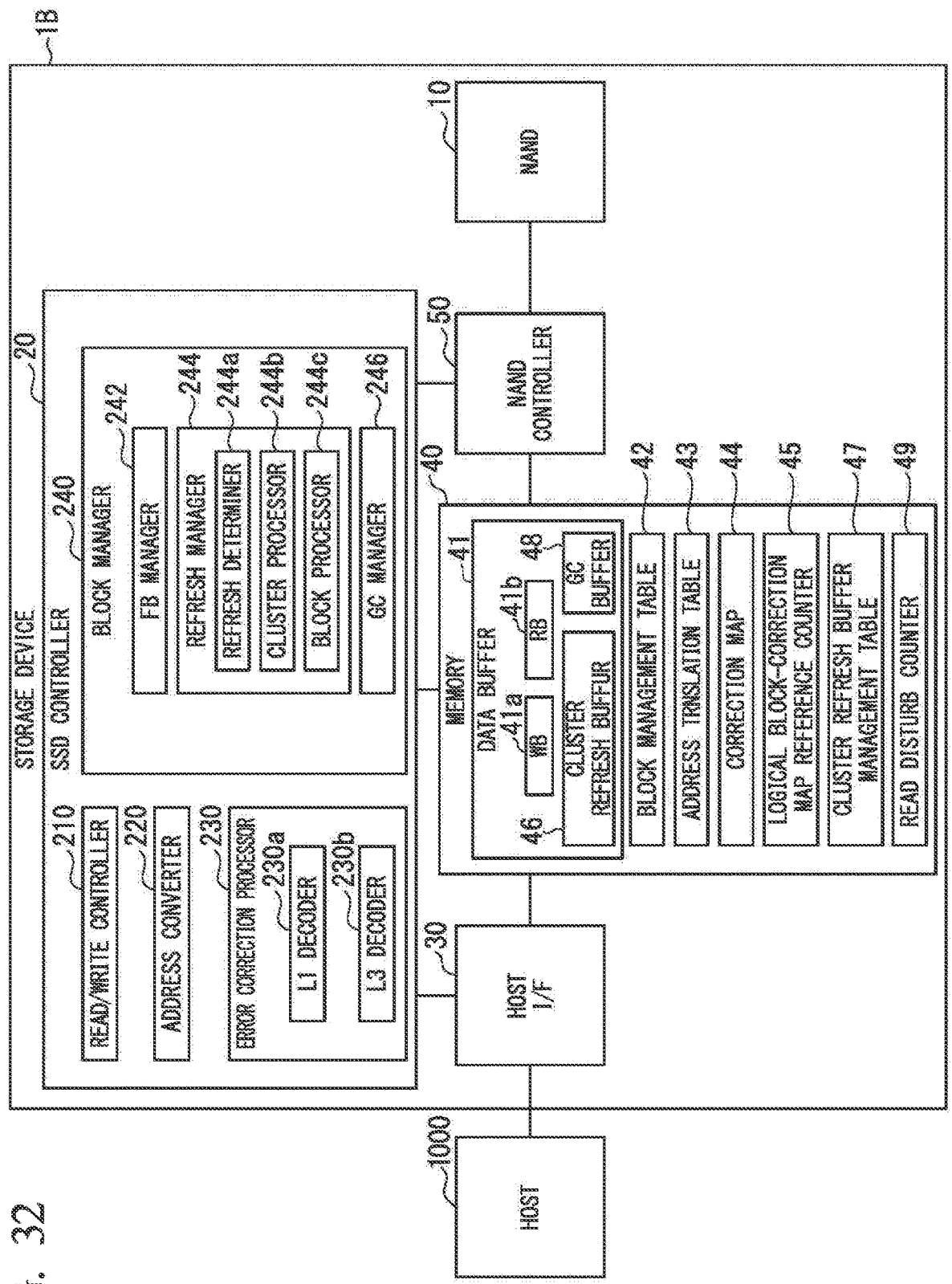
FIG. 32 is an example of a storage device according to a fifth modification of the embodiment.
Figure 33:
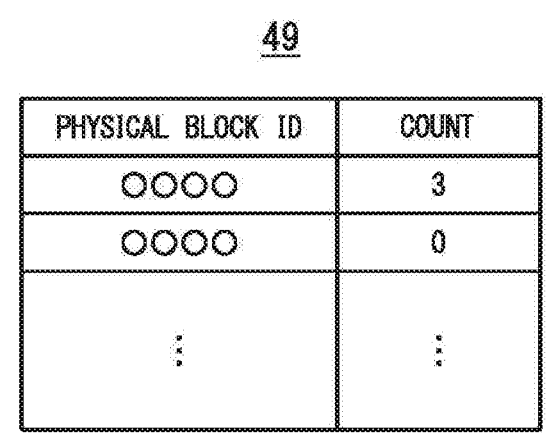

A fifth modification is an example in which a refresh is performed as a counter measure against a read disturb. FIG. 32 is a diagram showing a configuration of a storage device 1B of the fifth modification. The storage device 1B of the fifth modification includes a read disturb counter 49 in a memory 40 in addition to the configuration according to the above-described embodiment. FIG. 33 shows an example of the read disturb counter 49. The read disturb counter 49 is provided for each physical block of a NAND 10. Such a counter is reset if data in the corresponding physical block is erased and is incremented each time a sensing (read) operation is performed on any physical page in the corresponding physical block.

When a value of the read disturb counter 49 exceeds a threshold value, an SSD controller 20 determines that reliability of clusters included in the physical block corresponding to the read disturb counter 49 is likely to be damaged due to a read disturb. When such a determination is made, the SSD controller 20 may perform, for example, any one or more of the following three operation examples. Here, the operation examples of the SSD controller 20 are not limited to the following examples. Further, the threshold value may be a common value for all physical blocks, or different threshold values may be employed for different physical blocks. Further, a smaller value may be set, as a degree of fatigue (e.g., the number of cycles of writing and erasing) of the physical block increases.

OPERATION EXAMPLE 1

When a value of a read disturb counter 49 exceeds a threshold value, an SSD controller 20 performs a patrol (i.e., diagnosis or inspection) read on all clusters (including invalid clusters) in the physical block associated with the read disturb counter 49. The patrol read refers to checking whether or not data stored in a NAND 10 can be correctly read. "Reading data on a cluster correctly" means that data is successfully corrected by error correction using a first correction code, for example. In this operation example 1, the SSD controller 20 checks whether or not data stored in all clusters (including invalid clusters) in the physical block associated with the read disturb counter 49 can be read correctly. Further, the SSD controller 20 performs error correction using a second correction code on a cluster (including an invalid cluster) for which error correction using a first correction code has failed and performs refresh in units of cluster on the cluster.

OPERATION EXAMPLE 2

When a value of a read disturb counter 49 exceeds a threshold value, an SSD controller 20 performs a patrol read on all clusters (including invalid clusters) in the physical block associated with the read disturb counter 49. Further, the SSD controller 20 performs refresh in units of logical page on the logical page including a cluster for which error correction using a first correction code has failed. Note that, in this operation example, refresh in units of error correction group may be performed on the error correction group including the cluster for which the error correction using the first correction code has failed instead of the refresh in units of logical page.

OPERATION EXAMPLE 3

When a value of a read disturb counter 49 exceeds a threshold value, an SSD controller 20 performs a patrol read on all clusters (including invalid clusters) in the physical block associated with the read disturb counter 49. Further, the SSD controller 20 performs refresh in units of physical block on the physical block including a cluster for which error correction using a first correction code has failed.

OPERATION EXAMPLE 4

An SSD controller 20 unconditionally performs any one of the refresh in units of cluster, the refresh in units of logical page, the refresh in units of error correction group, and the refresh in units of physical block similar to the above-described operation examples 1 to 3 on a condition that only a value of a read disturb counter 49 exceeds a threshold value without performing a patrol read.

(Sixth Modification)

Figure 34:
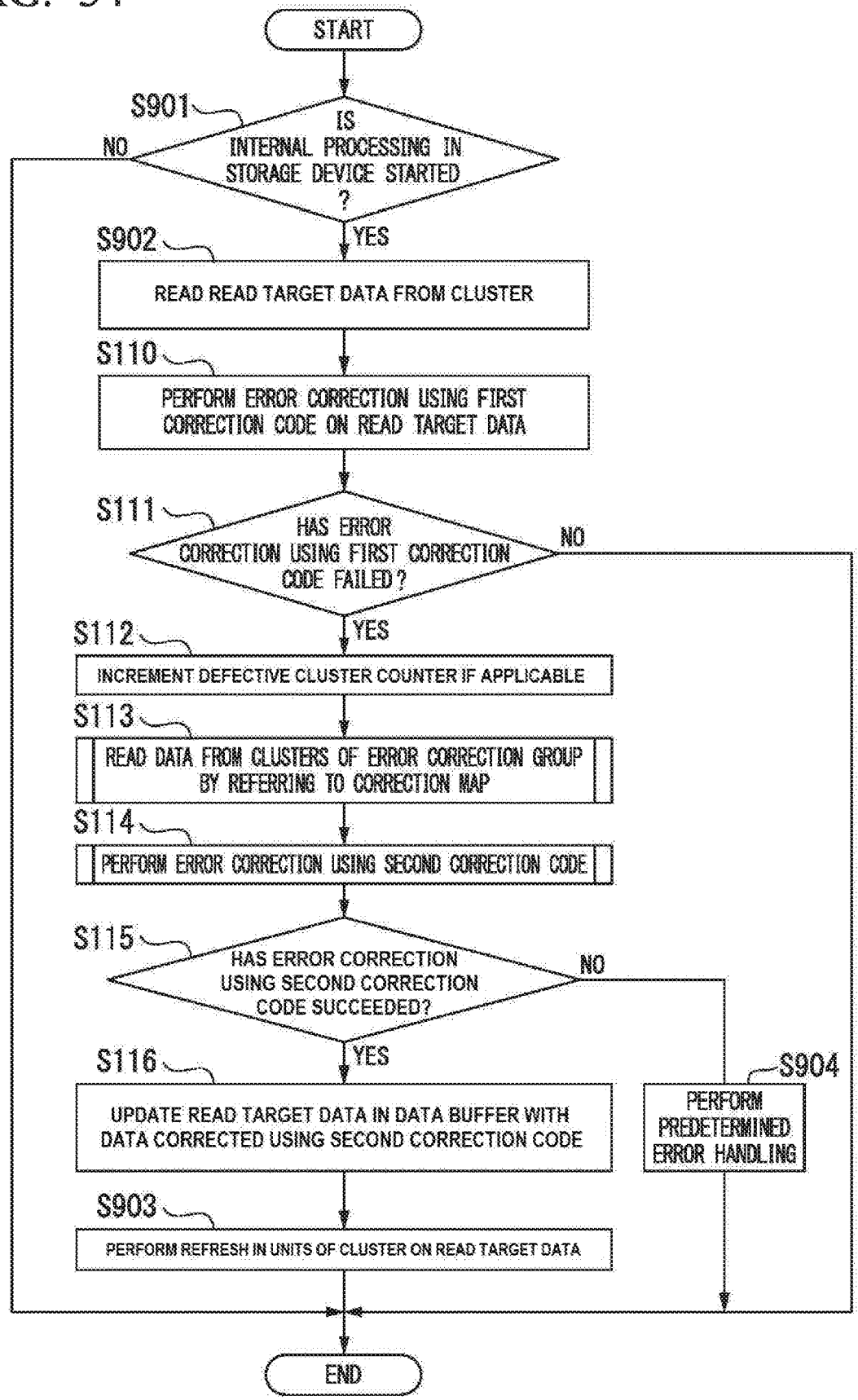
FIG. 34 is a flowchart showing an example of a flow of a refresh in units of cluster according to a sixth modification of the embodiment.

A sixth modification is an example in which refresh in units of cluster is performed when a predetermined condition is satisfied in internal processing of a storage device 1. FIG. 34 is a flowchart showing a flow of refresh in units of cluster according to the sixth modification. Note that a process which is the same as that described in FIG. 21 will be denoted with the same reference numeral and description thereof will be omitted.

The sixth modification is an example in which, when data is read from a NAND 10 through the internal processing of the storage device 1, the refresh in units of cluster is performed when error correction using a first correction code 100*b* performed on the data that has failed and error correction using a second correction code 150*b* thereon has succeeded. The internal processing is a process of reading data from the NAND 10 regardless of a read command from a host 1000. For example, the internal processing is not limited to various types of refresh processes or garbage collection described above, but also corresponds to a process of reading system data from the NAND 10 or wear leveling.

For example, an SSD controller 20 determines whether to start the internal processing (S901). The SSD controller 20 ends the process of the flowchart if the internal processing is not started (NO in S901).

The SSD controller 20 identifies a cluster in which read target data has been stored if the internal processing is started (YES in S901). The SSD controller 20 reads the read target data from the identified cluster (S902). The SSD controller 20 performs the processes of S110 to S116 as in the above-described embodiment. If the error correction using the second correction code 150*b* performed on the read target data has succeeded (YES in S115), the SSD controller 20 updates, on the data buffer 41, the read target data to the data on which the error correction has been performed (S116), and performs refresh in units of cluster on the read target data on which the error correction has been performed (S903). Note that the refresh process performed in the process of S903 is not limited to the refresh in units of cluster, but may be refresh in units of physical block or refresh in units of error correction group. In the sixth modification, if the error correction using the first correction code 100*b* in the process of S111 has succeeded (NO in S111), the SSD controller 20 ends the processes of this flowchart. On the other hand, if the error correction using the second correction code 150*b* performed on the read target data has failed (NO in S115), the SSD controller 20 performs a predetermined error handing (S904), and ends the processes of this flowchart. If the data for which the error correction using the second correction code 150*b* has failed is data related to the logical address, the predetermined error handling may be recording the fact that data is not correctable, and/or may be performing a reservation to return error when a read command regarding the data is received from the host 1000 in future. If the data for which the error correction using the second correction code 150*b* has failed is not data related to the logical address (e.g., system data such as management data or the like), the predetermined error process may be recording the failure of the device, and may be notifying the failure of the device to the host 100, for example.

According to such a configuration, the storage device 1 may perform the refresh in units of cluster or other types of refreshes even while the internal processing is being executed.

(Seventh Modification)

Figure 35:
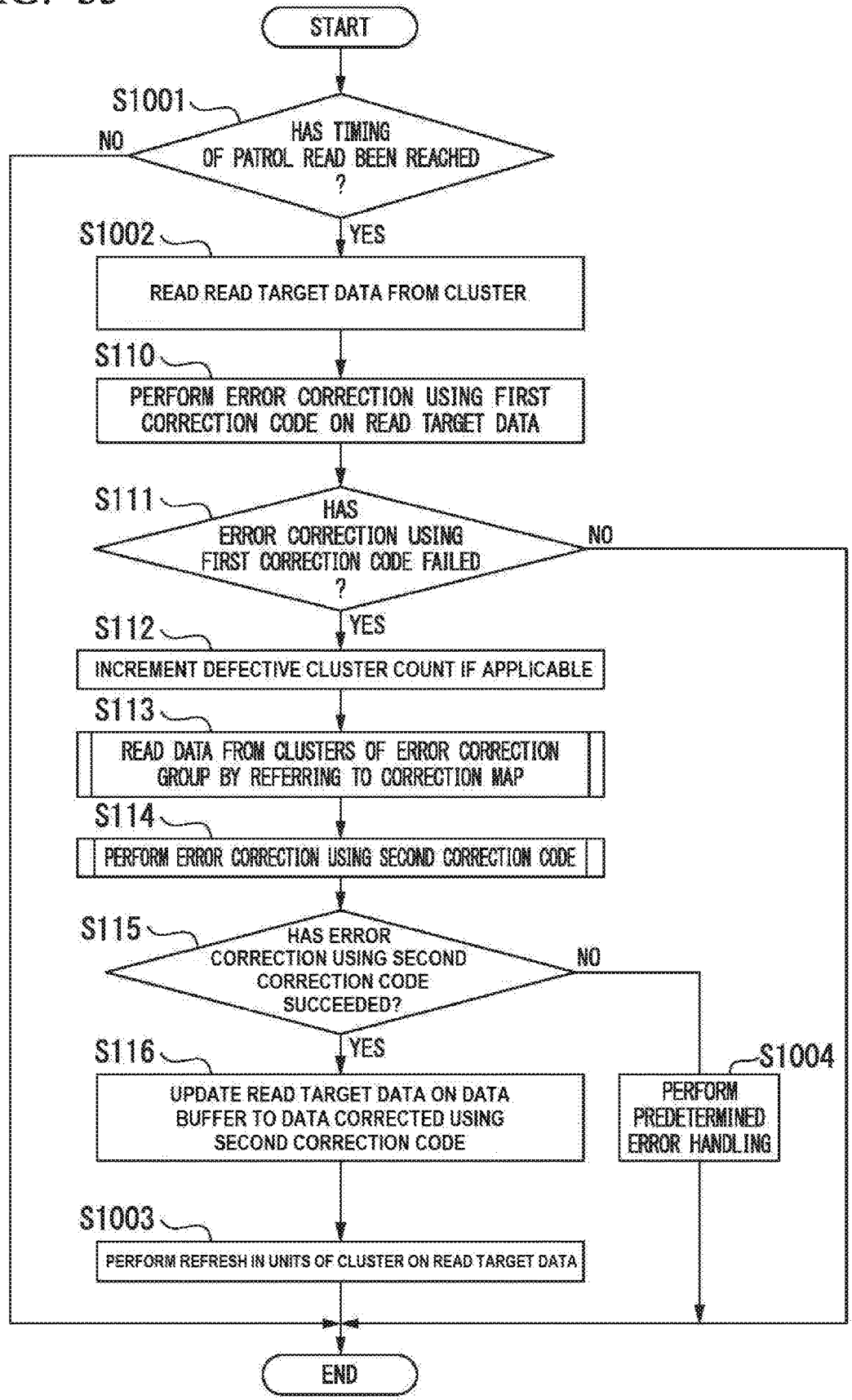
FIG. 35 is a flowchart showing an example of a flow of a refresh in units of cluster according to a seventh modification of the embodiment.

A seventh modification is an example in which refresh in units of cluster is performed when a predetermined condition is satisfied in a patrol (i.e., diagnosis or inspection) read performed at regular intervals. FIG. 35 is a flowchart showing a flow of refresh in units of cluster according to the seventh modification. Note that a process which is the same as that described in FIG. 21 will be denoted with the same reference numeral and description thereof will be omitted.

The seventh modification is an example in which, when data is read from a NAND 10 through the patrol read of the storage device 1, the refresh in units of cluster is performed when the error correction using the first correction code 100*b* performed on data that has been read has failed and the error correction using the second correction code 150*b* thereon has succeeded. For example, the patrol read is performed on all clusters (including invalid clusters) designated from an SSD controller 20.

For example, the SSD controller 20 determines whether to start the patrol read (S1001). The SSD controller 20 ends the process of the flowchart if the patrol read is not started (NO in S1001).

The SSD controller 20 identified a cluster in which read target data through the patrol read is stored if the patrol read is started (YES in S1001). The SSD controller 20 reads the read target data from the identified cluster (S1002). The SSD controller 20 performs the processes of S110 to S116 as in the above-described embodiment. If the error correction using the second correction code 150*b* performed on the read target data has succeeded (YES in S115), the SSD controller 20 updates the read target data to the data on which the error correction has been performed (S116), and performs the refresh in units of cluster on the read target data on which the error correction has been performed (S1003). Note that the refresh process performed in the process of S1003 is not limited to the refresh in units of cluster, but may be the refresh in units of physical block or the refresh in units of error correction group. In the seventh modification, if the error correction using the first correction code 100*b* in the process of S111 has succeeded (NO in S111), the SSD controller 20 ends the processes of this flowchart. On the other hand, if the error correction using the second correction code 150*b* performed on the read target data has failed (NO in S115), the SSD controller 20 performs a predetermined error handling (S1004), and ends the processes of this flowchart. The predetermined error handling in S1004 may be the same as the predetermined error handling described above in regard to S904.

According to such a configuration, the storage device 1 may perform the refresh in units of cluster or other types of refresh processes even while the NAND 10 is being inspected.

(Eighth Modification)

Figure 36:
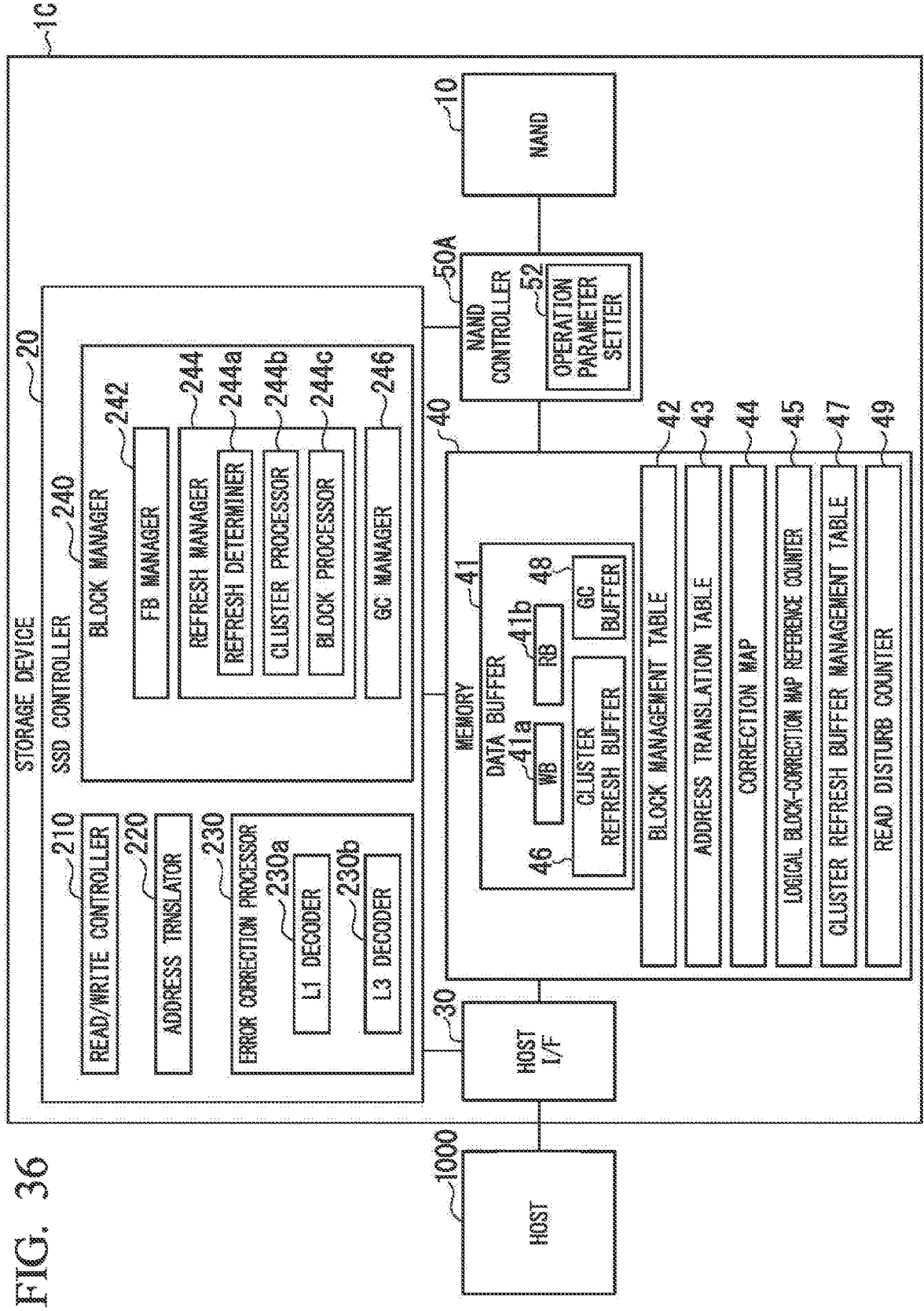
FIG. 36 is a diagram showing an example of a storage device according to an eighth modification of the embodiment.

An eighth modification is an example in which refresh in units of cluster is performed on data stored in clusters estimated to be deteriorated. FIG. 36 is a diagram showing an example of a storage device 1C according to the eighth modification. Note that a process which is the same as that described in FIG. 2 will be denoted with the same reference numeral and description thereof will be omitted.

The storage device 1C according to the eighth modification includes a NAND controller 50A. The NAND controller 50A includes an operation parameter setting unit 52 in addition to the functions described in the above-described embodiments. The operation parameter setting unit 52 is realized by hardware such as LSI, ASIC, FPGA, and PLD. Further, the operation parameter setting unit 52 may be realized by a processor such as a CPU configured to execute a program or may be realized by a combination of hardware and a program.

The operation parameter setting unit 52 sets operation parameters to be referred to when the NAND controller 50A performs read processing and/or write processing. The operation parameters are, for example, parameters used to determine a read voltage (read level) for reading data from the NAND 10. The operation parameter setting unit 52 may performs shift read processing to change the read voltage for reading of the data from a memory cell to a data latch in the NAND 10 in some cases. The shift read processing refers to a process of shifting the level of the read voltage. The operation parameter setting unit 52 performs the read processing on the NAND 10 at least once changing the read voltage through the shift read processing and determines, as an appropriate read voltage, a read voltage with read data in which the number of error bits is minimized, the number of error bits is below a predetermined value, or an error correction with the first correcting code has succeeded. Note that, when the read voltage is changed through the shift read processing, the operation parameter setting unit 52 may increase or decrease the read voltage by a predetermined step from a certain value as a starting point or may sequentially select a read voltage value from read voltage candidates prepared in advance.

Figure 37A:
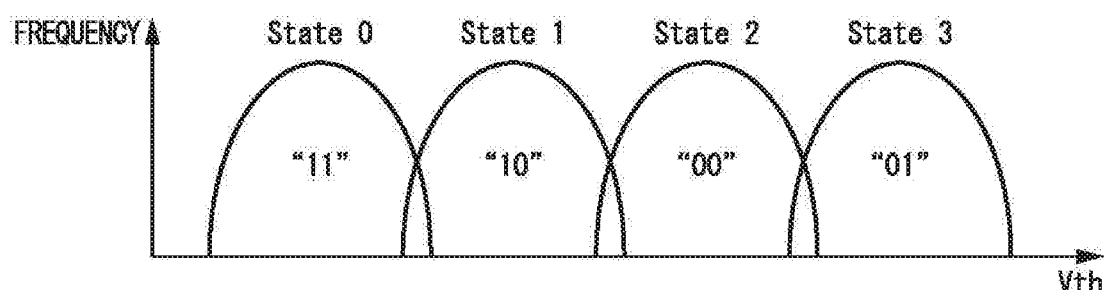
FIG. 37A is a diagram showing an example of distributions of threshold voltages in 2 bit cells in the eighth modification of the embodiment.

FIG. 37A is a diagram showing an example of distributions of threshold voltages in a 2-bit cell. In FIG. 37A, a horizontal axis represents a threshold voltage Vth. A vertical axis represents frequencies of memory cells having the same threshold voltage Vth. N=4 (=$2^2$) in a 2-bit cell where N is the number of states which may be taken by a memory cell in a NAND 10. The threshold voltages Vth of the memory cells form four lobes in accordance with stored bit information. Each lobe corresponds to bit information "11", "10", "00", and "01" in an order of threshold voltage from lower to higher. In addition, it can be said that the threshold voltages Vth of the memory cells belonging to the lobes are in State 0, State 1, State 2, and State 3.

Figure 37B:
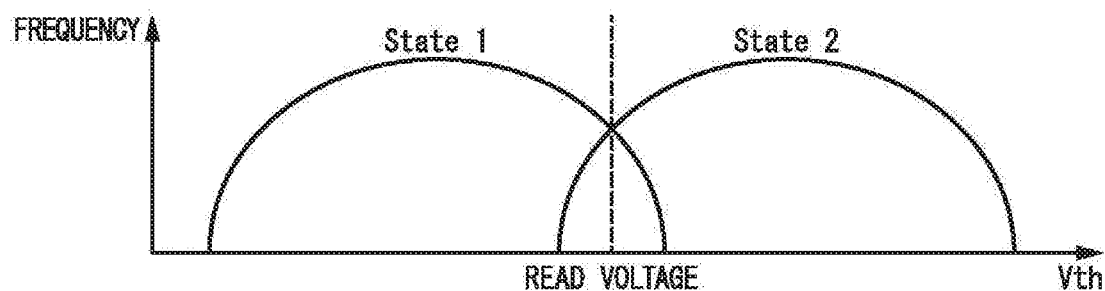
FIG. 37B is a diagram showing a relationship between the distribution of threshold voltages and a read voltage in the eighth modification of the embodiment.

FIG. 37B is a diagram schematically showing an example of a relationship between threshold voltages Vth of the memory cells and a read voltage. Here, FIG. 37B is an enlarged view obtained by selectively extracting State 1 and State 2 in FIG. 37A. As shown in FIGS. 37A and 37B, the neighboring lobes of threshold voltages Vth partially overlap in some cases. The operation parameter setting unit 52 sets the read voltage for distinguishing State 1 and State 2 so that a sum of a frequency of a memory cell written as State 1 being read as State 2 and a frequency of a memory cell written as State 2 being read as State 1 is minimized (or equal to or less than a certain threshold value). Thus, the read voltage serving as one of the operation parameters is estimated.

Since a distribution of the threshold voltage Vth changes in accordance with a degree of deterioration of data, an appropriate read voltage (a read voltage for making the number of error bits a minimum value, or a threshold value or less) changes in accordance with a degree of deterioration of the data. The operation parameter setting unit 52 may calculate a difference between the appropriate read voltage value determined in accordance with the degree of deterioration of the data with a predetermined voltage, and determine that refresh is required when the calculated difference exceeds a threshold value. In such case, the operation parameter setting unit 52 transmits the physical address of the cluster 100 including the memory cell in which the data is stored to an SSD controller 20. The SSD controller 20 sets the cluster 100 corresponding to the physical address received from the operation parameter setting unit 52 as a target of refresh in units of cluster and performs the refresh in units of cluster. Note that the refresh performed on the cluster 100 corresponding to the physical address received from the operation parameter setting unit 52 is not limited to the refresh in units of cluster, but may be refresh in units of physical block or refresh in units of error correction group. Note that a method for obtaining the appropriate read voltage is not limited to a method using shift read processing, but another method may be adopted.

As described above, according to the storage device 1 of the embodiment and modifications, for example, it is possible to suppress the occurrence of a late escaping cluster issue caused by defective clusters included in the error correction group 150 exceeding a correction capability of the second correction code 150b by managing a moving destination of cluster data 100a moved through the refresh using a correction map 44.

While certain embodiments have been described these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and their equivalents are intended to cover such forms or modifications as would fall within the scope and spirit of the inventions.)

What is claimed is:

1. A storage device comprising:
a non-volatile memory; and
a control circuit configured to store data in the non-volatile memory, read the data from the non-volatile memory in units of cluster, and erase data in units of logical block which includes a plurality of clusters, wherein data in each cluster includes a first error correction code and each cluster is arranged in at least one of a plurality of error correction groups, each of the error correction groups including a plurality of clusters and a second error correction code, wherein
the control circuit is configured to perform a refresh operation in units of cluster such that refresh target data in a first cluster of a first logical block is moved to a second cluster of a second logical block,
a first error correction group related to the refresh target data includes the first cluster of the first logical block before the moving, and
the first error correction group related to the refresh target data includes at least a cluster of the first logical block and a cluster of the second logical block after the moving.

2. The storage device according to claim 1, wherein
in response to a read request targeting data in a cluster of the first error correction group, the control circuit performs a read operation on the cluster and performs error correction on the data read from the cluster, and
the error correction includes a first error correction using a first error correction code included in the data read from the cluster and, if the first error correction fails, further includes a second error correction using a second error correction code of the first error correction group.

3. The storage device according to claim 2, wherein the second error correction includes reading data and the second error correction code from clusters of the first logical block and at least the second cluster of the second logical block.

4. The storage device according to claim 1, wherein the control circuit is further configured to perform a refresh operation in units of logical block such that all valid data stored in a target logical block are relocated into a write destination logical block.

5. The storage device according to claim 4, wherein
after said all valid data stored in the target logical block are relocated into the write destination logical block, the control circuit determines whether the target logical block contains any cluster that stores data moved from a cluster of another logical block that has not been released yet, and releases or does not release the target logical block based on the determination.

6. The storage device according to claim 1, wherein the control circuit maintains an address translation table and a correction map, and upon performing the refresh operation in units of cluster, does not update an entry in the address translation table corresponding to a logical address of the refresh target data, and updates an entry in the correction map.

7. The storage device according to claim 1, wherein the control circuit maintains an address translation table and a correction map, and upon performing the refresh operation in units of cluster, updates the correction map so that an entry corresponding to the first cluster of the first error correction group in the first logical block is associated with the second cluster of the second logical block.

8. The storage device according to claim 7, wherein
the control circuit maintains a read counter for each of a plurality of physical blocks of the nonvolatile memory, and
the control circuit performs the refresh operation in units of cluster on each of a plurality of clusters of a physical block when a read count of the physical block exceeds a threshold number.

9. A method of controlling a storage device including a non-volatile memory;
and a control circuit configured to store data in the non-volatile memory,
read the data from the non-volatile memory in units of cluster, and erase data in units of logical block which includes a plurality of clusters, wherein data in each cluster includes a first error correction code and each cluster is arranged in at least one of a plurality of error correction groups, each of the error correction groups including a plurality of clusters and a second error correction code, said method comprising:
performing a refresh operation in units of cluster such that refresh target data in a first cluster of a first logical block is moved to a second cluster of a second logical block, wherein
a first error correction group related to the refresh target data includes the first cluster of the first logical block before the moving, and
the first error correction group of the refresh target data includes at least a cluster of the first logical block and a cluster of the second logical block after the moving.

10. The method according to claim 9, further comprising:
in response to a read request targeting data in a cluster of the first error correction group, performing a read operation on the cluster; and
performing error correction on the data read from the cluster,
wherein the error correction includes a first error correction using a first error correction code included in the data read from the cluster and, if the first error correction fails, further includes a second error correction using a second error correction code of the first error correction group.

11. The method according to claim 10, wherein the second error correction includes reading data and the second error correction code from clusters of the first logical block and at least the second cluster of the second logical block.

12. The method according to claim 9, further comprising:
performing a refresh operation in units of logical block such that all valid data stored in a target logical block are relocated into a write destination logical block.

13. The method according to claim 12, further comprising:
after said all valid data stored in the target logical block are relocated into the write destination logical block, determining whether the target logical block contains any cluster that stores data moved from a cluster of another logical block; and
releasing or not releasing the target logical block based on the determination.

14. The method according to claim 9, further comprising:
maintaining an address translation table and a correction map; and
upon performing the refresh operation in units of cluster, updating an entry in the correction map while not updating an entry in the address translation table corresponding to a logical address of the refresh target data.

15. The method according to claim 9, further comprising:
maintaining an address translation table and a correction map; and
upon performing the refresh operation in units of cluster, updating the correction map so that an entry corresponding to the first cluster of the first error correction group in the first logical block is associated with the second cluster of the second logical block.

16. The method according to claim 15, further comprising:
maintaining a read count for each of a plurality of physical blocks of the nonvolatile memory; and
performing a refresh operation in units of cluster on each of a plurality of clusters of a physical block when a read count of the physical block exceeds a threshold number.

* * * * *